United States Patent
Kaiser, Jr. et al.

(10) Patent No.: US 11,444,652 B1
(45) Date of Patent: Sep. 13, 2022

(54) STEERABLE COMMUNICATIONS SYSTEM

(71) Applicant: Starry, Inc., Boston, MA (US)

(72) Inventors: Joseph A. Kaiser, Jr., Hopkinton, MA (US); Joseph T. Lipowski, Norwell, MA (US)

(73) Assignee: Starry, Inc., Boston, MA (US)

( * ) Notice: Subject to any disclaimer, the term of this patent is extended or adjusted under 35 U.S.C. 154(b) by 536 days.

(21) Appl. No.: 16/419,939

(22) Filed: May 22, 2019

Related U.S. Application Data

(60) Provisional application No. 62/674,999, filed on May 22, 2018.

(51) Int. Cl.
| | |
|---|---|
| *H04B 1/40* | (2015.01) |
| *H03D 7/14* | (2006.01) |
| *H04B 1/04* | (2006.01) |
| *H04B 1/403* | (2015.01) |
| *H04B 1/18* | (2006.01) |
| *H04B 1/00* | (2006.01) |
| *H04B 1/30* | (2006.01) |
| *H03D 7/16* | (2006.01) |

(52) U.S. Cl.
CPC ............ *H04B 1/40* (2013.01); *H03D 7/1441* (2013.01); *H03D 7/1458* (2013.01); *H03D 7/165* (2013.01); *H04B 1/005* (2013.01); *H04B 1/0475* (2013.01); *H04B 1/18* (2013.01); *H04B 1/30* (2013.01); *H04B 1/406* (2013.01)

(58) Field of Classification Search
CPC ........ H04B 1/40; H04B 1/005; H04B 1/0475; H04B 1/18; H04B 1/30; H04B 1/406; H03D 7/1441; H03D 7/1458; H03D 7/165
See application file for complete search history.

(56) References Cited

U.S. PATENT DOCUMENTS

| | | | |
|---|---|---|---|
| 4,994,773 | A | 2/1991 | Chen et al. |
| 5,442,231 | A | 8/1995 | Miyamoto et al. |
| 6,381,286 | B1 | 4/2002 | Wilkinson et al. |
| 6,711,204 | B2 | 3/2004 | Schilling |
| 8,125,277 | B1 | 2/2012 | Opsahl |
| 2006/0014509 | A1 | 1/2006 | Xu et al. |
| 2007/0077962 | A1 | 4/2007 | Lewis |
| 2010/0328185 | A1* | 12/2010 | Soler Castany ..... H01Q 1/2283 343/860 |
| 2011/0105054 | A1* | 5/2011 | Cavin ..................... H03L 7/22 455/86 |
| 2012/0314811 | A1 | 12/2012 | Goldfarb |

(Continued)

FOREIGN PATENT DOCUMENTS

WO    9120126 A1    12/1991

OTHER PUBLICATIONS

International Search Report and Written Opinion for Application No. PCT/US19/33599, together with the Written Opinion of the International Searching Authority, dated Nov. 1, 2019, 20 pages.

*Primary Examiner* — Zhitong Chen
(74) *Attorney, Agent, or Firm* — Nutter McClennan & Fish LLP

(57) ABSTRACT

Various embodiments disclosed herein enable steerable, time division duplex ("TDD") communications channels at millimeter-wave frequency bands. Among other things, embodiments disclosed herein provide improved steering accuracy and power distribution, lower power consumption, and potentially longer service life than previous transceiver systems.

12 Claims, 18 Drawing Sheets

(56) References Cited

U.S. PATENT DOCUMENTS

| | | |
|---|---|---|
| 2013/0270605 A1 | 10/2013 | Salcedo et al. |
| 2014/0029653 A1* | 1/2014 | Soltanian ................ H03L 7/099 375/221 |
| 2015/0235771 A1 | 8/2015 | Van Kampen et al. |
| 2015/0244548 A1 | 8/2015 | Weissman et al. |
| 2015/0262961 A1 | 9/2015 | Jones et al. |
| 2017/0026205 A1* | 1/2017 | Agee ..................... H04W 28/14 |
| 2017/0069583 A1 | 3/2017 | Tsukahara |

* cited by examiner

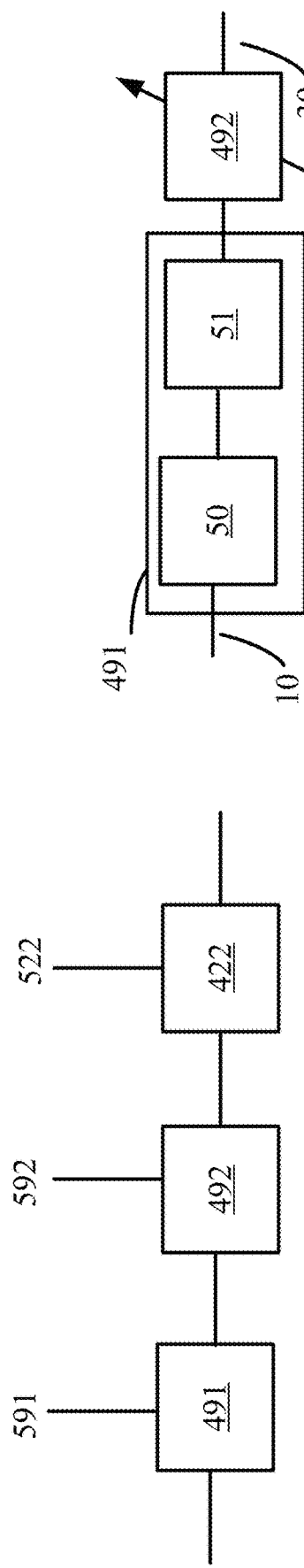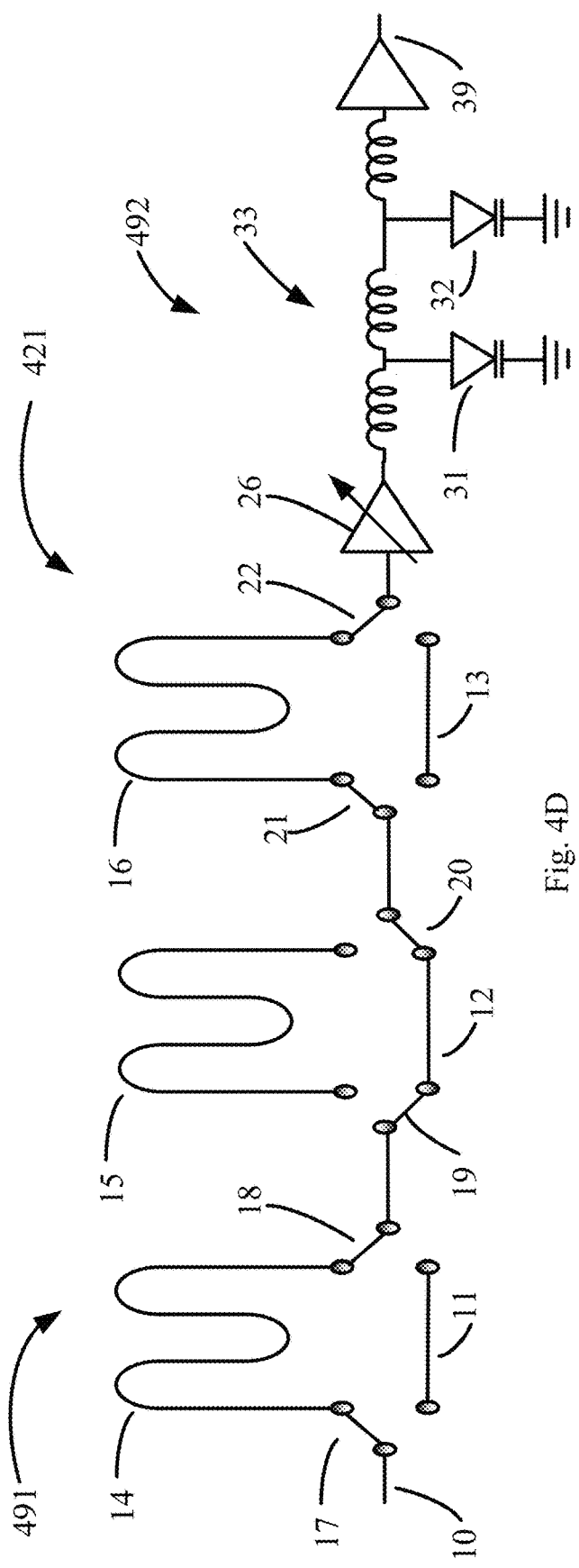

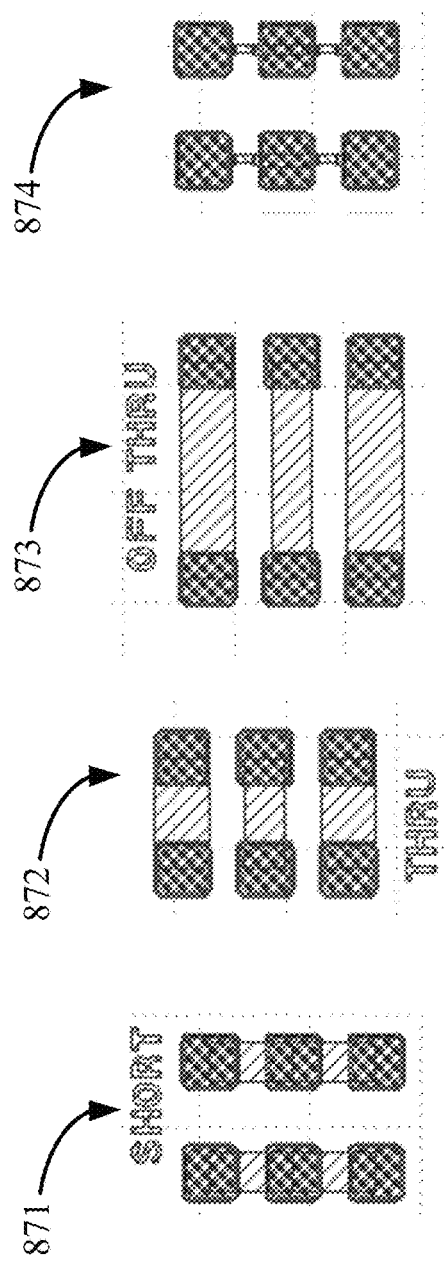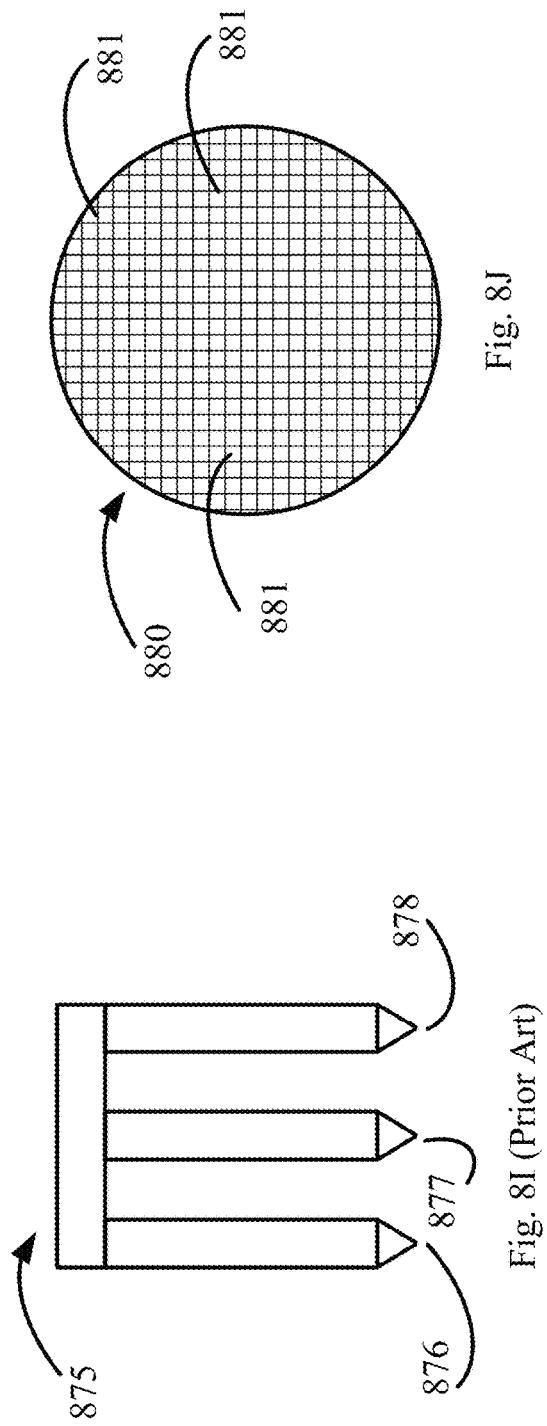
Fig. 8E (Prior Art)
Fig. 8F (Prior Art)
Fig. 8G (Prior Art)
Fig. 8H (Prior Art)
Fig. 8I (Prior Art)
Fig. 8J

US 11,444,652 B1

STEERABLE COMMUNICATIONS SYSTEM

RELATED APPLICATIONS

This application claims priority to U.S. provisional patent application Ser. No. 62/674,999, filed May 22, 2018 and titled "Steerable Communications System," naming Joseph A. Kaiser, Jr. and Joseph Thaddeus Lipowski as inventors. The disclosure of the foregoing application is incorporated herein, in its entirety, by reference.

TECHNICAL FIELD

The present invention relates to transceiver systems, and more particularly to steerable transmission systems.

BACKGROUND ART

Steerable transmitter and receiver systems are known from the fields of phased-array military radar to transmit an electromagnetic pulse and to receive a reflection of that pulse.

SUMMARY OF THE EMBODIMENTS

In accordance with one embodiment of the invention, a frequency converter integrated circuit operable in a transmit mode and a receive mode. The circuit includes a receive input; a receive output; a receive channel operably coupled between the receive output and the receive output, the receive channel including a receive mixer; a transmit input; a transmit output; a transmit channel operably coupled between the transmit output and the transmit output, the transmit channel including a transmit mixer.

The circuit also includes a local oscillator source configured to provide an LO signal. In some embodiments, the local oscillator source is an on-chip oscillator, and in some embodiments the local oscillator source is an input terminal operably coupled to an off-chip oscillator.

The circuit also includes an LO switch having an input coupled to the local oscillator source, a first output coupled to the receive mixer, and a second output coupled to the transmit mixer. The LO switch is configured, in a receive configuration, to controllably couple the LO signal to the receive mixer, and in a transmit configuration to couple the LO signal to the transmit mixer such that the LO is coupled to only one of the receive mixer or the transmit mixer at a time.

Some embodiments also include a low-noise amplifier operably coupled between the receive input and the receive mixer. The low-noise amplifier is controllably operable in a powered mode and an unpowered mode. More specifically, the low-noise amplifier is in the powered mode when the LO signal is coupled to the receive mixer, and in the unpowered mode when the LO signal is not coupled to the receive mixer.

Preferred embodiments include a mode controller in control communication with the LO switch to control the LO switch to change between the receive configuration and the transmit configuration. In some embodiments, the mode controller is in control communication with the low-noise amplifier to change between the powered mode and the unpowered mode, such that the low-noise amplifier changes between the powered mode and the unpowered mode contemporaneously with the change of the LO switch between the receive configuration and the transmit configuration.

Some embodiments of a frequency converter integrated circuit, operable in a transmit mode and a receive mode, include a receive input; a receive output; and a low-noise amplifier having an amplifier input operably coupled to the receive input and an amplifier output operably coupled to the receive output. The low-noise amplifier is controllably operable in a powered mode when the integrated circuit is in the receive mode, and an unpowered mode when the integrated circuit is not in the receive mode. To that end, the circuit includes a mode controller in control communication with the low-noise amplifier to controllably change between the powered mode and the unpowered mode.

Another embodiment provides a front-end integrated circuit operable in a transmit mode and a receive mode. The circuit includes transmit input; a transmit output; and a high-performance power amplifier having an amplifier input operably coupled to the transmit input and an amplifier output operably coupled to the transmit output. The high-performance power amplifier is controllably operable in a powered mode when the integrated circuit is in the transmit mode, and an unpowered mode when the integrated circuit is not in the transmit mode.

In some embodiments, the front-end integrated circuit integrated circuit also includes a mode controller in control communication with the high-performance power amplifier to controllably change between the powered mode and the unpowered mode.

Yet another embodiment provides a front-end integrated circuit operable in a transmit mode and a receive mode. The circuit includes an antenna interface and an interface switch. The switch includes a pole in electrical communication with the antenna interface to alternately receive signals from the antenna interface and provide signals to the antenna interface; a receive throw characterized by a receive insertion loss when the receive throw is coupled to the pole; and a transmit throw having a transmit insertion loss when the transmit throw is coupled to the throw, wherein the transmit insertion loss and the receive insertion loss are asymmetric. For example, in some embodiments the receive insertion loss is at least two times the transmit insertion loss.

Another embodiment provides a controllable phase-shifter system disposed in a signal chain to impart a phase shift on a signal. In preferred embodiments, the controllable phase-shifter system includes two independently controllable phase shifters in electrical series, to controllably shift the signal through a continuous range of phase delay, such that the phase shift imparted on the signal is the sum of the phases imposed by the two phase shifters.

In some embodiments, the composite phase range of the two phase shifters is 360 degrees. In some embodiments, the composite phase range of the two phase shifters is 400 degrees.

In another embodiment, an integrated circuit transceiver system has a transmit channel and two receive channels associated with the transmit channel. The system includes a transmit channel (having a transmit input terminal; a transmit output terminal; a transmit signal path operably coupled between the transmit input terminal and the transmit output terminal, the transmit signal path including a transmit up-conversion mixer), and a first receive channel (having a first receive input terminal; a first receive output terminal; and a first receive signal path operably coupled between the first receive input terminal and the first receive output terminal, the first receive signal path including a first receive down-conversion mixer), and a second receive channel (having a second receive input terminal; a second receive output terminal; and a second receive signal path operably coupled between the second receive input terminal and the second receive output terminal, the second receive signal path including a second receive down-conversion mixer). The system also has a local oscillator input terminal configured to receive a local oscillator signal having a first frequency. An LO generation system is coupled to the local oscillator input terminal, and configured to upconvert the first frequency to a second, higher frequency to produce an LO drive signal. The LO generation system operably coupled to the first receive down-conversion mixer to provide the LO drive signal to the first receive down-conversion mixer; and the transmit up-conversion mixer to provide the LO drive signal to the transmit up-conversion mixer, and to the second receive down-conversion mixer to provide the LO drive signal to the second receive down-conversion mixer. As described, the transmit channel is associated, by their shared LO drive signal, with the first receive channel and the second receive channel.

In some embodiments of the integrated circuit transceiver system, the LO drive signal includes a first LO drive signal and a second LO drive signal, and the LO system generator includes a first local oscillator multiplier coupled to the local oscillator input terminal, and configured to upconvert the first frequency to the second, higher frequency to produce the first LO driver signal. The first local oscillator multiplier is operably coupled to the first receive down-conversion mixer to provide the first LO drive signal to the first receive down-conversion mixer. The integrated circuit transceiver system also includes a second local oscillator multiplier coupled to the local oscillator input terminal, which is configured to upconvert the first frequency to the second, higher frequency to produce the second LO drive signal, the second local oscillator multiplier operably coupled to the transmit up-conversion mixer to provide the second LO drive signal to the transmit up-conversion mixer, and to the second receive down-conversion mixer to provide the second LO drive signal to the second receive down-conversion mixer.

In some such embodiments of the integrated circuit transceiver system, the transmit channel, the first receive channel and the second receive channel are on a single integrated circuit, and the single integrated circuit further includes an LO switch having an input coupled to the second local oscillator multiplier, a first output coupled to the transmit up-conversion mixer, and a second output coupled to the second receive down-conversion mixer, the LO switch configured, in a receive configuration, to controllably couple the second LO drive signal to the second receive down-conversion mixer, and in a transmit configuration to couple the second LO drive signal to the transmit up-conversion mixer such that the second LO drive signal is coupled to only one of the second receive down-conversion mixer or the transmit up-conversion mixer at a time.

Some embodiments of the integrated circuit transceiver system further include a first integrated circuit that includes the transmit input terminal, the transmit output terminal, the transmit channel, the LO input terminal, and the LO generation system. Such a first integrated circuit further includes an LO output terminal; an on-chip LO power divider having an input coupled to the LO generation system, a first on-chip divider output and a second on-chip divider output, the LO power divider configured to divide an output of the LO generation system into the second LO drive signal at the second divider output, and an output LO drive signal at the first divider output. The second divider output is operably coupled to the second receive down-conversion mixer. The first divider output is operably coupled to the LO output terminal. The first integrated circuit also includes the first receive input terminal, the first receive output terminal, first receive channel, and the second receive input terminal.

Such embodiments also include a second integrated circuit that includes the first receive input terminal, the first receive output terminal, the first receive channel, the second receive input terminal, the second receive output terminal, the second receive channel, a first receive LO input terminal and a second receive LO input terminal.

Further, the system includes an off-chip LO power divider having an off-chip divider input operably coupled to the LO output terminal of the first integrated circuit; a first off-chip divider output operably coupled to the first receive LO input terminal of the second integrated circuit; and a second off-chip divider output operably coupled to the second receive LO input terminal of the second integrated circuit.

Some such embodiments also include a beam former circuit, the beam former circuit including a third integrated circuit having transmit channels and receive channels, the third integrated circuit having a first plurality of antenna terminals coupled to a first patch array antenna; and a fourth integrated circuit having only receive channels, the fourth integrated circuit having a second plurality of antenna terminals coupled to a second patch array antenna.

Some such embodiments further include a substrate, wherein the first integrated circuit, the second integrated circuit and the off-chip LO power divider all disposed on the substrate. For example, the substrate may be a printed circuit board.

Another embodiment includes an up-conversion integrated circuit for upconverting an outbound signal. The up-conversion integrated circuit includes an intermediate frequency signal input for receiving the outbound signal having a first spectrum; an LO generation circuit configured to produce a local oscillator signal, the local oscillator signal having a frequency greater than the first spectrum. The up-conversion integrated circuit also includes a single-balanced upconverter mixer configured for high-side injection, the mixer including: (i) a signal input terminal coupled to the transceiver input; (ii) a local oscillator input coupled to the LO generation circuit to receive the local oscillator signal; and (iii) a upconverted signal output. The up-conversion integrated circuit further includes an RF output coupled to the upconverted signal output; and an LO output terminal coupled to the LO generation circuit to provide the local oscillator signal to another integrated circuit.

In some such embodiments, the LO generation circuit includes a passive power divider having a power divider input and two power divider output. The passive power divider is disposed to divide the local oscillator signal and supply the local oscillator signal to (a) the local oscillator input of the single-balanced upconverter mixer and to (b) the LO output terminal.

Some embodiments further include a DC bias control circuit operably coupled to the single-balanced upconverter mixer to enable fine-tuning of the FET balance to adjust local oscillator signal cancellation at the RF output.

Some embodiments further include a set of internally-disposed DC bondpads, each of the internally-disposed bond pads disposed on an interior portion of a top surface of the integrated circuit, wherein the interior portion includes at least fifty percent of the top surface extending from the geometric center of the top surface.

In some embodiments, the up-conversion integrated circuit has a top surface, and further includes an RF signal trace; a probe port including: a clearing on a top surface of the integrated circuit, the clearing free of obstructions and allowing probe access to the top surface; a first ground pad disposed within the clearing, and coupled to chip ground; a second ground pad disposed within the clearing, and coupled to chip ground; and a signal pad electrically coupled to the RF signal trace. The signal pad is disposed between the first ground pad and the second ground pad, within the clearing, such that the signal pad, the first ground pad, and the second ground pad are aligned in a single line.

In some such embodiments, the top surface of the up-conversion integrated circuit defines a plane, and the signal pad has a dimension in the plane such that, when the RF signal trace is severed by a gap through the signal pad, to form a first segment and a second segment electrically isolated from the first segment on opposing sides of the gap, first segment, the first ground pad, and the second ground pad are aligned in a single line such that the terminals of a three-terminal probe may simultaneously contact the first segment, the first ground pad, and the second ground pad, respectively.

In some such embodiments, the up-conversion integrated circuit has a top surface, and further includes an RF signal trace on the top surface of the up-conversion integrated circuit. Such embodiments also have an attenuator including a first resistor having a first end and a second end; a first bond pad coupled to the first end of the first resistor; a second resistor having a third end and a fourth end; a second bond pad coupled to the third end of the second resistor; a ground pad; and a third resistor having a fifth end electrically coupled to the second end of the first resistor and the fourth end of the second resistor, and a sixth end coupled to the ground pad. The first bond pad and the second bond pad are disposed near the RF signal trace such than an operator may wire bond the first bond pad to a first segment of the RF trace, and may wire bond the second bond pad to a second segment of the RF trace. The first segment of the RF trace and the second segment of the RF trace are electrically isolated by a severance gap, such that a signal traveling through the RF trace is forced to travel through the attenuator.

Another embodiment is an integrated circuit for down-converting an inbound signal from a from a distal transmitter. The integrated circuit includes a first downconversion channel having a first RF input and a first double-balanced downconversion mixer coupled to a first balun, the first RF input coupled to the first double-balanced downconversion mixer by a first RF trace. The integrated circuit also includes a second downconversion channel having a second RF input and second double-balanced downconversion mixer coupled to a second balun, the second RF input coupled to the second double-balanced downconversion mixer by a second RF trace. Further, the integrated circuit includes a first LO terminal disposed to receive a local oscillator signal; a second LO terminal disposed to receive the local oscillator signal; a first LO trace coupled between the first LO terminal and the first balun; and a second LO trace coupled between the second LO terminal and the second balun. The second LO trace crosses over the first RF signal trace at a crossover location, the first RF signal trace isolated from the second LO trace by an intervening insulator layer at the crossover location.

In some such embodiments, the second RF trace does not cross, on the integrated circuit, any of the first RF trace, the first LO trace, and the second LO trace.

In some embodiments, the integrated circuit has a top surface that defines a plane of the integrated circuit, and first RF signal trace has a first width in the plane of the integrated circuit, and the second LO trace has a second width in the plane of the integrated circuit. However, at the crossover location, the first RF signal trace has a third width less than the first width, and the second LO trace has a fourth width less than the second width.

In a wafer embodiment, a semiconductor wafer having a plurality of at least 50 integrated circuits, wherein each integrated circuit of the plurality of integrated circuits is electrically isolated from each of the other integrated circuits of the plurality of integrated circuits, and at least a majority of the integrated circuits on the wafer each includes a set of at least two architecturally distinct calibration standards.

In some embodiments, each of at least seventy-five percent of integrated circuits on the wafer includes a set of at least two architecturally distinct calibration standards. Moreover, in some embodiments, each of the integrated circuits on the wafer includes a set of at least two architecturally distinct calibration standards.

BRIEF DESCRIPTION OF THE DRAWINGS

The foregoing features of embodiments will be more readily understood by reference to the following detailed description, taken with reference to the accompanying drawings, in which:

FIG. 4C schematically illustrates an embodiment of an attenuation system;

FIG. 4D schematically illustrates an embodiment of a phase shifter;

FIG. 4E schematically illustrates another embodiment of a phase shifter;

FIG. 8E, FIG. 8F, FIG. 8G and FIG. 8H each schematically illustrates an embodiment of a calibration standard;

FIG. 8I schematically illustrates a three-terminal probe;

FIG. 8J schematically illustrates a wafer of integrated circuits;

DETAILED DESCRIPTION OF SPECIFIC EMBODIMENTS

Various embodiments disclosed herein enable steerable, time division duplex ("TDD") communications channels at millimeter-wave frequency bands. Among other things, embodiments disclosed herein provide improved steering accuracy and power distribution, lower power consumption, and potentially longer service life than previous transceiver systems.

In short, embodiments described here enable a system with favorable attributes of single-channel systems (high power and low NF [Noise Figure]) with the benefits of multi-channel active electronically scanned array ("AESA") type systems (spatial power-combining and steering).

System Overview

Figure 1:
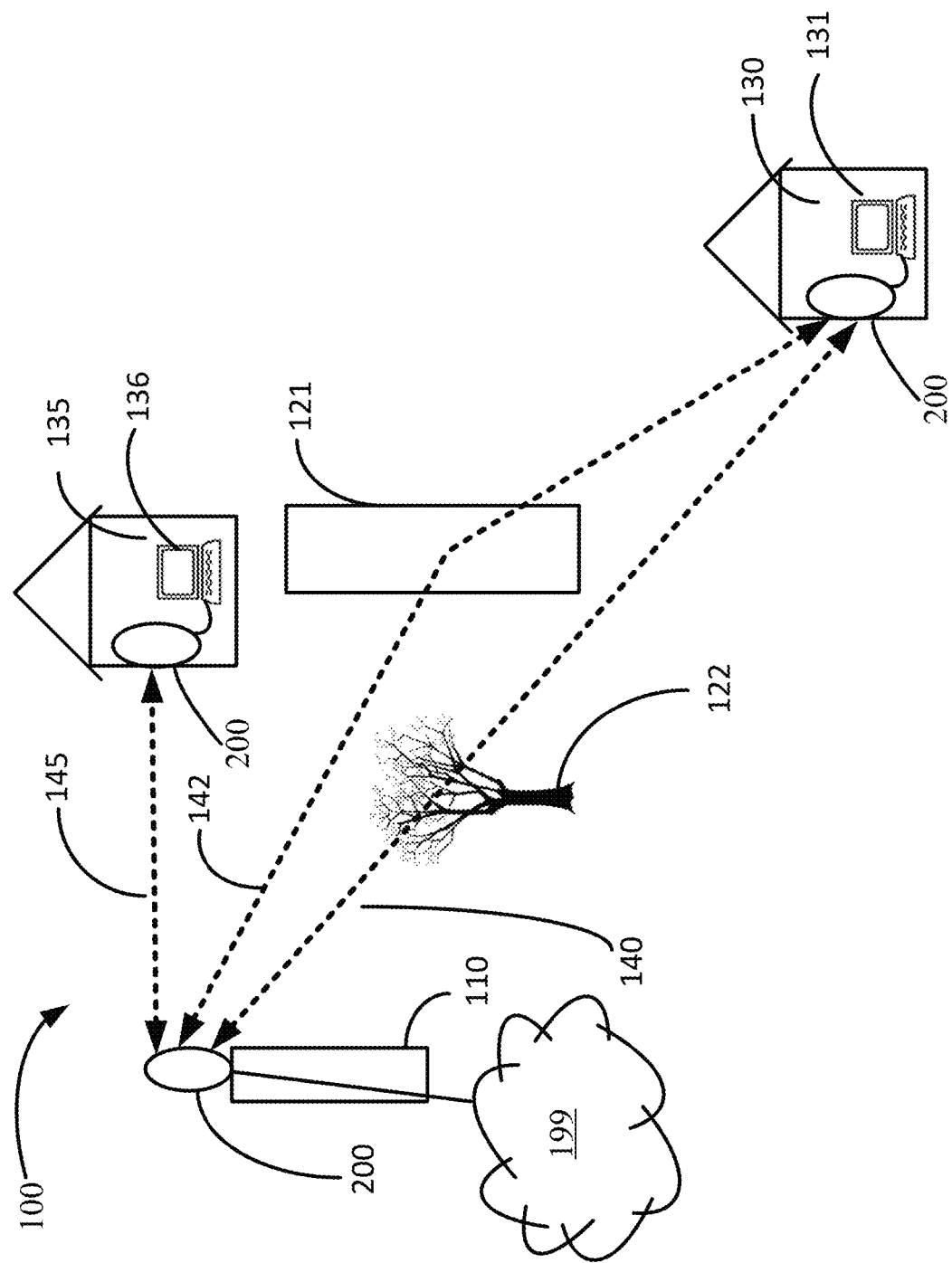
FIG. 1 schematically illustrates an embodiment of a steerable communication system.

FIG. 1 schematically illustrates an embodiment of a steerable communication system 100 in which a central transceiver 200 on top of building 110 communicates, in time division duplex, with corresponding transceivers 200 at customer premises 130 and 135.

For example, in an illustrative embodiment, the communication system 100 provides, to computers 131 and 136 at the customer premises 130 and 135, access to the Internet 199.

In operation, the transceiver 200 at building 110 steers its antennas to communicate over a given frequency channel with transceiver 200 at customer premises 130 to form a temporary dedicated communications path 140. Although the communication path 140 is bidirectional, typical Internet users download a larger quantity of data (i.e., from internet service provider ("ISP") to customer) than they upload (from customer to ISP). Consequently, in its TDD communications, the transceiver 200 at building 100 is in transmit mode for a greater percentage of time than in receive mode, and the transceiver 200 at the customer premises 130 is in receive mode for a greater percentage of time than in transmit mode. To accommodate such use, illustrative embodiments of integrated circuits and systems described herein have two receive channels for teach transmit channel (in other words, the ratio of receive channels to transmit channels is 2:1).

At another time, the transceiver 200 at building 110 terminates communication path 140, and redirects its antennas to form another temporary dedicated communications path 142 to communicate with transceiver 200 at customer premises 135.

By creating and terminating individual, dedicated communication paths 140 and 142 at alternate times, the transceiver 200 at building 110 can provide Internet access to both customer premises 130 and 135 in a manner that appears, to the customers at those premises, effectively continuous. In other words, Internet users at customer premises 130 and 135 are unaware that they are not continuously connected to the Internet, but instead are connected only at discrete times for limited periods. Among other benefits, the system 100 allows efficient use of available spectrum by establishing bidirectional communication with several customer premises 130, 135 using only a single frequency channel.

Situations may arise to suggest a change in a communication path. For example, communication path 140 may perform adequately in winter months, when tree 122 has no leaves, but its performance may undesirably degrade in summer months when leaves are present. Consequently, transceiver 200 at building 110 may redirect its antennas to establish an alternate communication path 142 to the transceiver 200 at customer premises 130. The alternate communication path 142 may, for example, reflect off of another building 121.

Transceiver

Figure 2:
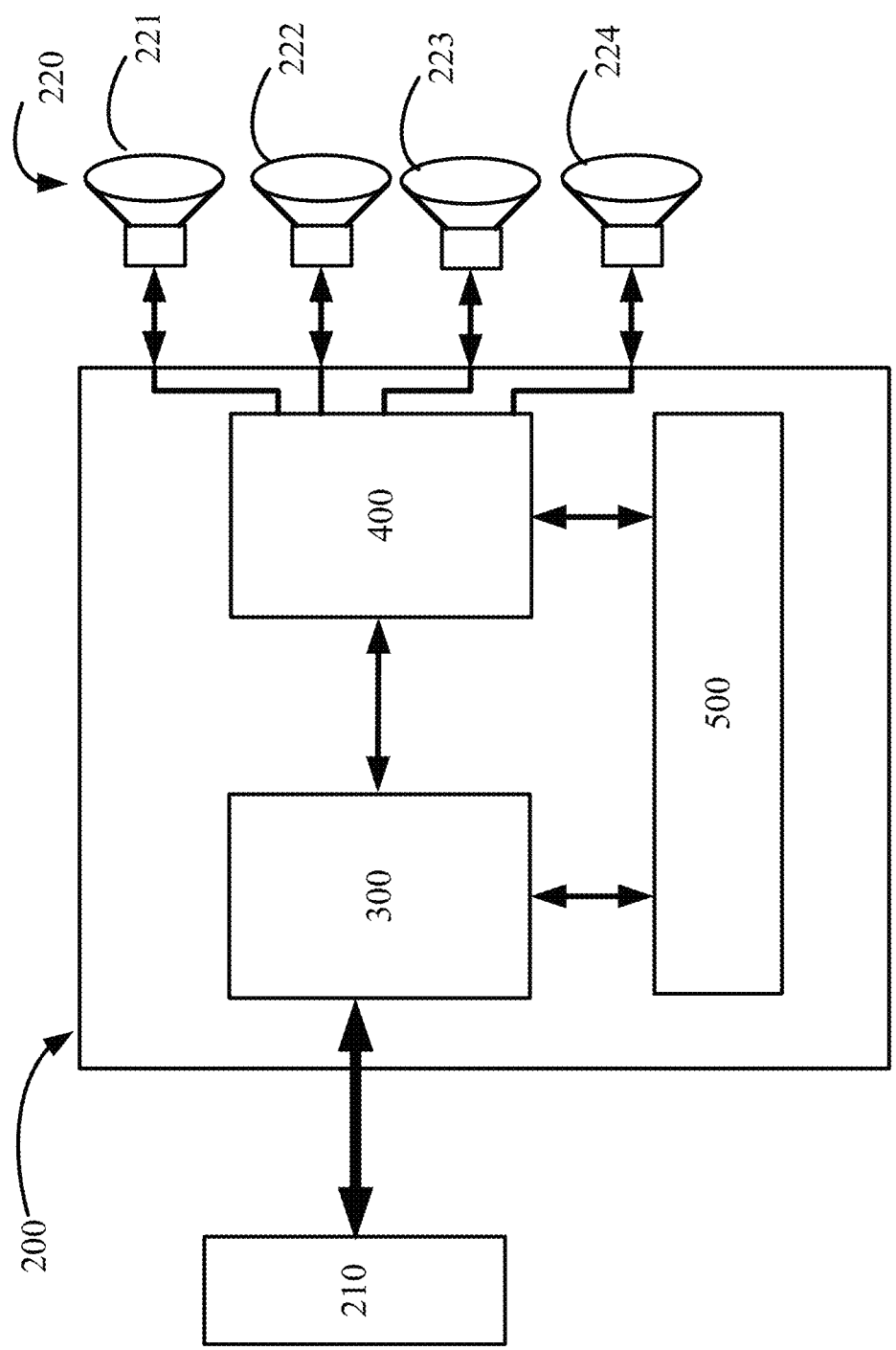
FIG. 2 schematically illustrates an embodiment of a transceiver system for use in a steerable communication system.

FIG. 2 schematically illustrates an embodiment of a transceiver 200 operably coupled between an interface 210 (e.g., a connection to the Internet 199, or to a customer computer 131) and an antenna array 220. The transceiver 200 is operable alternately in a transmit mode and a receive mode, under control of a controller 500.

In a transmit mode, communication signals from interface 210 (which may be intermediate frequency ("IF") signals, modulated at 5 MHz to name but one illustrative example) enter a frequency converter 300 circuit, which modulates the signals to produce modulated signals at a desired transmission frequency for communication over a communication channel (e.g., 140, 141, 242) as described above. Front-end circuit 400 then processes the modulated signals and provides the processed modulated signals to the antenna array 220 for transmission. The front-end circuit may be referred-to as a "beam former" circuit.

In receive mode, received signals from the antenna array 220 enter the front-end circuit 400, which processes the received signals and provides them to the frequency converter 300. The frequency converter 300 demodulates the received signals to produce demodulated signals, and provides the demodulated signals to the interface 210.

Frequency Converter

Figure 3A:
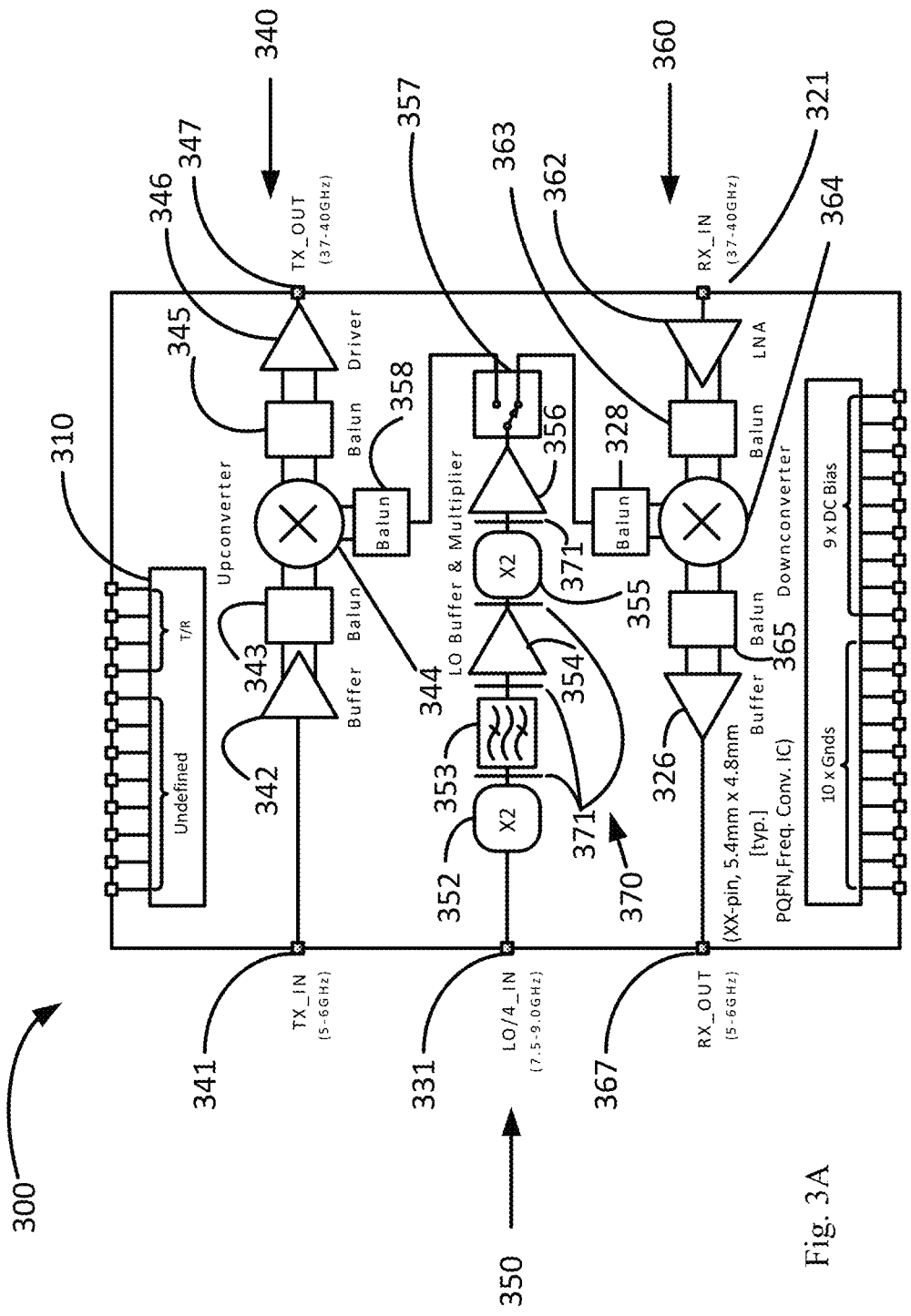
FIG. 3A schematically illustrates an embodiment of a frequency converter circuit.

An illustrative embodiment of a frequency converter circuit 300 is schematically illustrated in FIG. 3A, and includes a single receive channel 320 and a single transmit channel 340.

The transmit channel 340 begins at TX input 341 and includes an input buffer 342, followed by a balun 343, an upconverter mixer 344, and another balun 345 followed by a TX output driver 346 coupled to TX output 347.

The receive channel 360 (which may be referred-to as the first receive channel 360) is operably coupled between a first receive input 361 and a first receive output 367. The first receive channel 360 includes a low noise amplifier 362, followed by a balun 363 and a downconverter mixer 364, another balun 365 and a first RX output buffer 366 coupled to the first receive output 367.

In illustrative embodiments, the low noise amplifier 362 may have higher performance characteristics than would conventionally be selected. For example, conventional design practice holds that an amplifier should be selected to meet the noise specifications of the system in which it is to be used, while providing gain sufficient to offset the anticipated downstream losses—e.g., mixer losses and losses in the analog front-end circuitry—and that amplifiers with performance greater than necessary to accomplish the foregoing ends should be avoided because a higher performance low-noise amplifier ("LNA") would be more complex to design and implement, and would undesirably consume more power and produce more heat.

Although it is counterintuitive, the LNA 322 in preferred embodiments has performance greater than necessary to accomplish the foregoing ends. For example, the LNA 322 may be a high-gain (e.g., +24 dB) low noise amplifier combined with low distortion (e.g., with a high third order input intercept point, "IIP3"). Such an amplifier 322 provides several benefits. For one, the signal input to the LNA 322 is typically small, relative to the signal-handling capacity of the LNA 322, and so does not normally drive the LNA close to going non-linear. Consequently, the amplified signal produced by the LNA 322 is very clean, even if not very powerful (compared to the LNA's full power potential). Moreover, in the event the signal is at a high level (as when the source of a received signal is nearby) the LNA's high IIP3 will enable improved distortion reception. This provides for the highest dynamic range within practical limits for the receive signal chain. Such an LNA 322 enables higher modulation rates than signal chains with lower-performance amplifiers.

In addition, the high gain LNA 322 also allows a designer to add a filter to the signal chain (e.g., to reduce environmental noise), since the LNA 322 is sufficiently powerful to offset any loss or signal attenuation imposed by such a filter.

In illustrative embodiments, each of the mixers of the transmit channel 340 and the receive channel 360 is a double-balanced mixer that is tunable to account for the temperature at which it operates, the frequency at which it operates, or both. More specifically, the mixers include field-effect transistors ("FETs"), and the system 200 "tunes" the voltages at which the FETs operate to optimize IP3 for the temperature and frequency at which the mixer is used.

Conventional tuning of FET voltages holds that the tuning should be optimal for the variable at issue. For example, if tuning a mixer to operate at a given frequency, the mixer is tuned to optimize its performance at that frequency. If tuning a mixer to operate at a given temperature, the mixer is tuned to optimize its performance at that temperature. The inventors realized, however, that tuning for a single one of the variables (frequency or temperature) risks degrading the circuit's performance in view of the other variable.

The inventors also realized that the best solution for the two variables collectively (temperature and frequency) may mean that the FETs are not tuned optimally for at least one variable, and possibly both (i.e., any one of them, or both, could be tuned to a more optimal state, but at the expense of making their combination less than the best available combination).

Moreover, the inventors have realized that there is a relationship, or interdependence, among the FET tuning voltages in that changing a first one of them will cause a change the operation of the FET that renders one or both other voltages inadequate, and therefore require an adjustment of one or both of the others (which, in turn, may create a need to re-adjust the first voltage . . . ).

Subsequently, the inventors realized the benefit of avoiding such an iterative adjustment process. Consequently, preferred embodiments adjust all of the voltages in a single step that accounts for the interdependence. For example, in preferred embodiments, the adjustment is performed by use of a look-up-table (LUT) stored in the memory 501 of the controller 500. The look-up-table takes, as input, the temperature and frequency, and dictates the desired voltages for the mixer's FET tuning voltage. The voltage is then supplied to the FETs from the control signal generator 502. It should be noted that the tuning supplied by the look-up-table may tune the FETs in a way that is not optimal for at least one of the variable. In other words, although it is counter-intuitive, some embodiments tune the FETs to voltages that are sub-optimal for (a) the frequency at which the mixers operate, (b) the temperature at which the mixers operate, or (c) both the frequency and temperature at which the mixers operate.

The mixers of the transmit channel 340 and the receive channel 360 are driven by a branch 350 (which may be referred-to as the first branch 350) of the local oscillator system. To that end, the frequency converter 300 circuit includes a local oscillator ("LO") source 331 that provides a local oscillator signal. In some embodiments, the local oscillator source is an on-chip oscillator, and in preferred embodiments the local oscillator source 332 is a local oscillator input terminal operably coupled to an off-chip oscillator.

The first branch 350 of the LO system includes a first multiplier 352 (or frequency doubler) that doubles the frequency of the LO signal, a filter 353, first buffer 354, a second multiplier (or frequency doubler) 355, and a second buffer 356. The second buffer 356 provides the LO signal to a first LO switch 357.

Figure 6B:
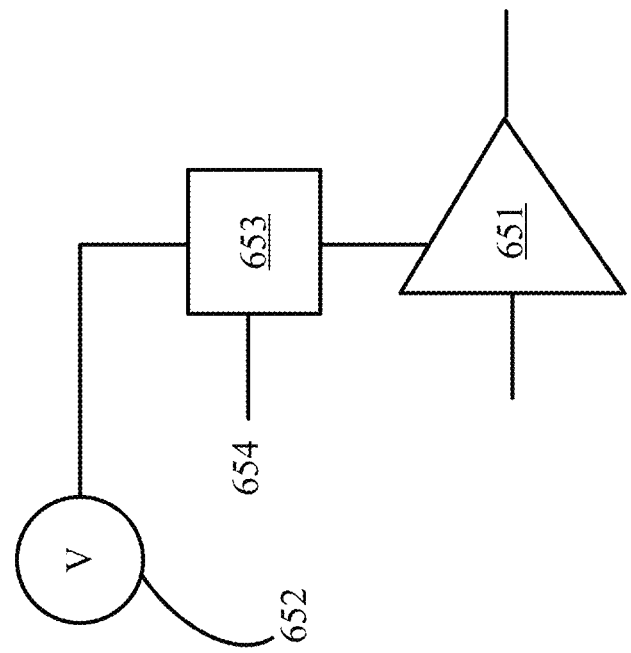
FIG. 6B schematically illustrates a power control system.
Figure 6A:
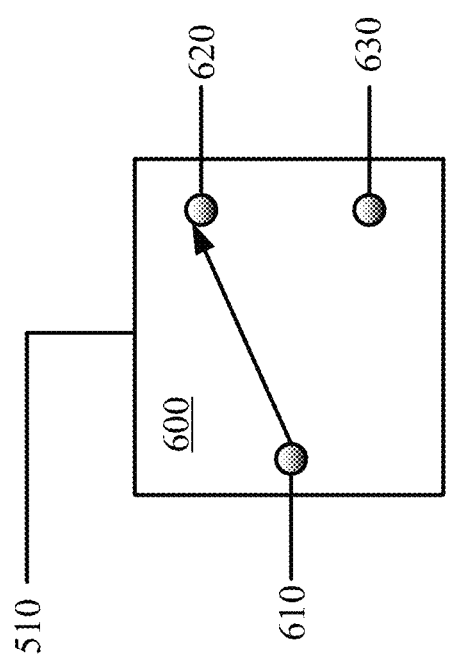
FIG. 6A schematically illustrates a switch.

In preferred embodiments, the LO switch 357 is a single-pole double-throw (SPDT) switch 600, as schematically illustrated in FIG. 6A. An SPDT switch 600 has a single pole 610 that is alternately controllably coupleable exclusively to the two throws 620, 630. In other words, when the pole 610 is coupled to a first throw 620, a signal may propagate between the pole 610 and the first throw 620, while none of that signal propagates from the pole 610 to the second throw 630. Similarly, when the pole 610 is coupled to the second throw 630, a signal may propagate between the pole 610 and the second throw 630, while none of that signal propagates from the pole 610 to the first throw 620. Unless otherwise noted, all switches described herein may be SPDT switches.

In some embodiments, the switch (e.g., 357, 600) includes one or more FETs. Conventional FET switch design holds that the FETs are driven at a voltage below the total available supply voltage (in other words, the FETs are driven below the "rails"). In contrast to that convention, preferred embodiments drive the FETs at the rails. This has the benefit of producing, in the switch, faster switching time, and improves the IIP3 performance of the front-end circuit 400.

In a transmit mode, the first LO switch 357 provides the LO signal to the transmit mixer 344 through balun 358, and in a receive mode, the first LO switch 357 provides the LO signal to the first receive mixer 364 through balun 367.

It should be noted that, in transmit mode, the first LO switch 357 does not provide the LO signal to the receive mixer 364, and in receive mode the first LO switch 357 does not provide the LO signal to the transmit mixer 344.

Some embodiments of the frequency converter 300 include a distributed filter in the local oscillator system. As shown in FIG. 3A, the local oscillator system creates an LO signal by multiplying the frequency of an input signal by 4 (via the two doublers 352; 355). The LO signal may include spurious signals (e.g., at harmonics and mixing intermodulation distortion (IM) products) that may undesirably infect the transmit and receive channels, and may undesirably leak to and impede the operation of other nearby circuits, such as the front-end circuit 400.

Consequently, in illustrative embodiments, the local oscillator system includes a distributed filter system 370 having a plurality of band-pass filters 371 disposed along the LO signal chain to pass the LO signal, and reduce spurious signal(s) power level. Some embodiments also include a high pass filter at the output of the signal chain. That high pass filter is configured to pass the radio frequency signal while significantly attenuating LO to meet U.S. Federal Communications Commission ("FCC") spectral mask requirements.

One benefit of such a filtering architecture arises from the realization that no one of the filter elements has to do all of the filtering work by itself. The distributed filter is a synergistic system in which each filter element performs only a portion of the overall filtering, yet all filter elements together implement the overall filter transfer function. Consequently, each filter can be designed to have a lower Q and/or lower insertion loss than would a single filter with the same or equivalent transfer function. Moreover, the attenuation imposed by the distributed filters is distributed throughout the signal chain, so no single element of the signal chain bears the entire burden of counteracting that attenuation.

Figure 3B:
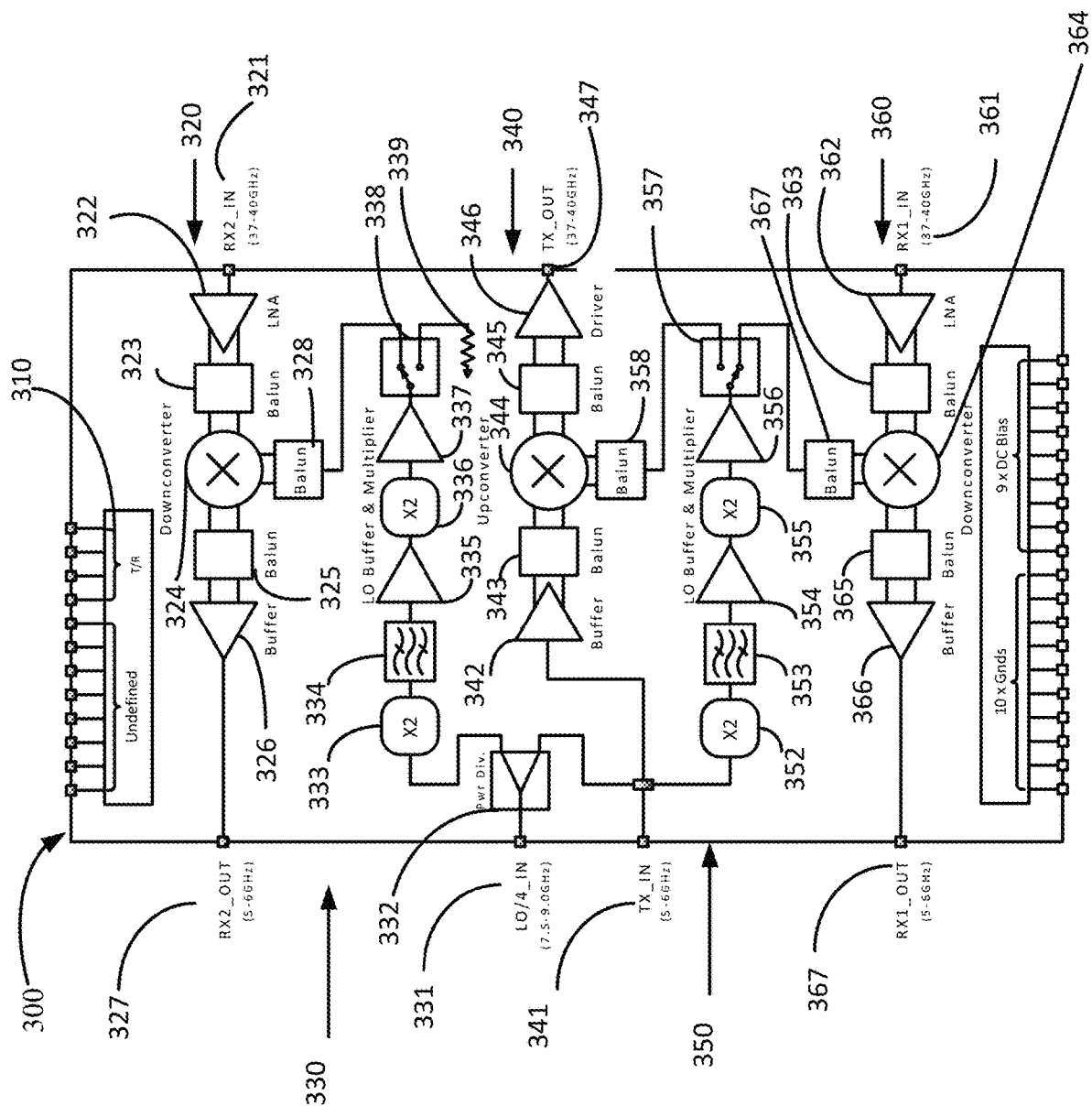
FIG. 3B schematically illustrates another embodiment of a frequency converter circuit.

FIG. 3B schematically illustrates another embodiment of a frequency converter 300 having two receive channels 320 and 360, one transmit channel 340, and a local oscillator system with two branches 330 and 350.

The second receive channel 320 has a similar architecture to the first receive channel 360, with a low noise amplifier 322, followed by a balun 323 and a downconverter mixer 324, another balun 325 and a first RX output buffer 326 coupled to the second receive output 327.

The embodiment of FIG. 3B includes a power divider 332 that divides the local oscillator signal from the local oscillator source 331 into the two branches 330 and 350 of the LO system. The second branch 330 of the LO system is similar to the first branch 350, and in the receive mode provides the LO signal to the second receive mixer 324 through the second LO switch 338. However, the second branch 330 does not provide the LO signal to the transmit mixer 344. Rather, in the transmit mode, the second LO switch 338 couples the LO signal to ground through load impedance 339.

A benefit of the architecture of FIG. 3B is that the two receive channels 320 and 360 can be independently controlled. For example, when the system 200 is in the process of changing from receive mode to transmit mode, the LO signal in the first LO switch 357 can be controlled to direct the LO signal to the receive mixer 344 at a point in time before the second LO switch 338 switches its LO signal to ground (e.g., by signal 511). Consequently, the second receive channel 320 remains active, and is able to process received signals, while the transmit channel 340 comes on-line. This enables the frequency converter circuit 200 to transition from receive mode to transmit mode with little, if any, delay and little if any or interruption in its ability to process received signals during that transition.

A benefit of the embodiments of FIG. 3A and FIG. 3B, in depriving the transmit mixer 344 of the LO signal when the frequency converter circuit 300 is in receive mode, is that the transmit channel 340 is effectively deactivated, thereby reducing its power draw, and reducing any noise that might otherwise be produced by the transmit channel 340 and coupled into the first or second receive channels 360, 320.

Alternatively, or in addition, some circuit elements of the frequency converter circuit 300 may be powered-off when the frequency converter circuit 300 is in the transmit mode, and some circuit elements may be powered-off when the frequency converter circuit 300 is in the receive mode. For example, when the frequency converter circuit 300 is in the transmit mode, the low noise amplifiers 362 and 322, and the buffers 366 and 326 may be powered-off in response to a mode signal 510 from the controller 500. When the frequency converter circuit 300 is in the receive mode, TX buffer 342 and driver 346 may be powered-off in response to the mode signal 510 from the controller 500.

Yet another benefit of the embodiment of FIG. 3B arises in that, when the transmit channel 340 is physically disposed between the first receive channel 360 and the second receive channel 320, the circuitry and semiconductor material of the (deactivated or powered-off) receive channel 340 acts has a physical buffer to mitigate crosstalk between the first receive channel 360 and the second receive channel 320.

As shown in FIG. 3A and FIG. 3B, the frequency converter integrated circuits include electrical interfaces to communicate with the controller 500. More specifically, the frequency converter circuits include a T/R interface 411 to receive the mode signals 510 and 511. The frequency converter circuits 300 may thus be said to be in control communication with the controller 500.

Figures 3C, 3D:
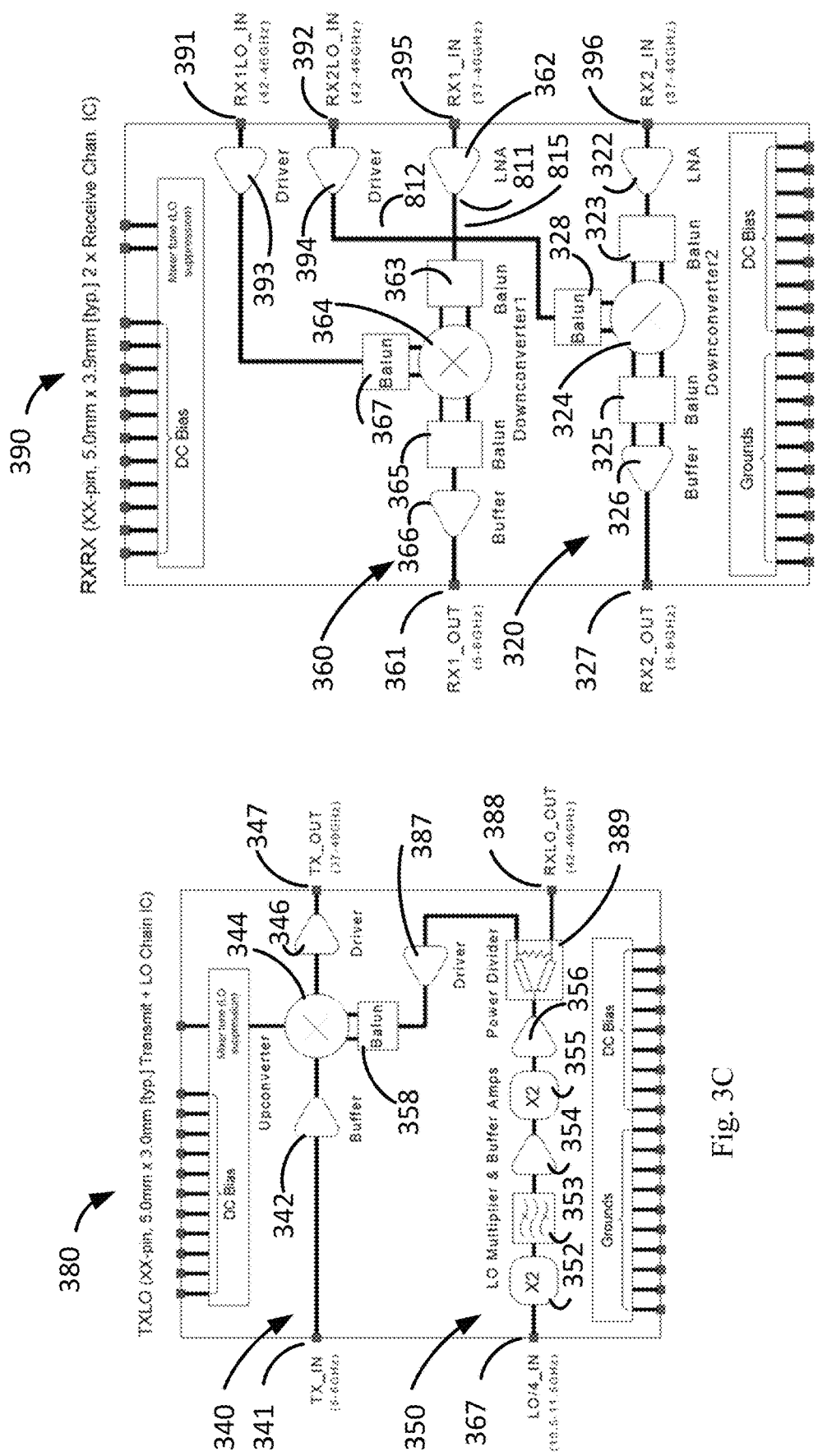
FIG. 3C and FIG. 3D schematically illustrate an embodiment of a two-chip frequency converter circuit system.

FIG. 3C and FIG. 3D schematically illustrate an embodiment of a two-chip frequency converter integrated circuit system.

FIG. 3C schematically illustrates an embodiment of a frequency upconverter integrated circuit 380. The upconverter circuit 380 has a transmit input terminal 341 coupled to a buffer 341. In illustrative embodiments, the upconverter circuit 380 receives an IF signal having a spectrum at an intermediate frequency (e.g., not a baseband signal), and upconverts that IF signal to a radio frequency (RF signal).

The output of the buffer 342 is coupled to an upconverter mixer 344. The upconverter mixer 344 in illustrative embodiments has a mixer input, a mixer output, and a double-balanced local oscillator input. The output terminal of the upconverter mixer 344 is coupled to a driver 346, and the output of the driver 346 is coupled to the transmit output terminal 347.

The upconverter mixer 344 is configured for high-side injection. In other words, the frequency of the local oscillator signal is greater than the highest frequency of the spectrum of the RF signal. Consequently, the signal produced at the mixer output has an image (or "upper sideband") having frequencies above the local oscillator frequency (a high-side image), whereas the main RF band (or "lower side band") is below the local oscillator frequency (a low-side image). The spectrum of the image below the local oscillator frequency is reversed relative to the spectrum of the input IF signal.

Both images are supplied by the upconverter mixer 344 to the output driver 346. However, the bandwidth of the output driver 346 is limited, and rolls off by at least 3 dB at the local oscillator frequency, and greater than 3 dB at the frequency of the high-side image. For example, in various embodiments, the bandwidth of the output driver 346 rolls off by at least 6 dB, 9 dB, 12 dB or more at the local oscillator frequency. Consequently, the signal produced by the output driver 346 (and the RF signal output at the transmit output terminal 347) includes the reverse-spectrum low-side image, but is substantially free of the local oscillator signal and the high-side image. As such, the RF signal output at the transmit output terminal 347 is effectively only the low-side image, and its spectrum is reversed relative to the input signal.

The upconverter circuit 380 also includes an LO generator circuit coupled between an LO input terminal 367 and an LO output terminal 388. The LO generator system is similar to the circuit described in connection FIG. 3A, and also includes the distributed filter 370, although for purposes of clarity the distributed filter 370 is not included in FIG. 3C. However, rather than a switch 357, the LO generator system of upconverter circuit 380 has a power divider 389 with two outputs. One output of the power divider is coupled to an LO output terminal 388, and the other output of the power divider 389 is coupled to an LO driver 387. In illustrative embodiments, the power divider 389 is passive power divider.

FIG. 3D schematically illustrates an embodiment of a frequency downconverter integrated circuit 390. The downconverter circuit 390 has a first downconversion channel coupled between receive input terminal 395 and receive output terminal 361, and a second downconversion channel coupled between receive input terminal 396 and receive output terminal 327. The first and second downconversion channels are substantially as described in connection with FIG. 3A, above.

The frequency downconverter integrated circuit 390 also has a first LO input terminal 391 and a second LO input terminal 392, configured to receive an LO signal, such as the LO signal produced and output by the frequency upconversion circuit 381 at terminal 388. Because the received LO signal has likely been attenuated on its journey from the upconverter circuit 380, the downconverter circuit 390 has first and second LO drivers 393 and 394 corresponding to the first and second LO input terminal 391 and 392, respectively. The output of each LO driver is input to a corresponding balun 367 and 328, in the first and second downconversion channels, respectively.

It should be noted that second the LO driver 394 is coupled to its corresponding balun 328 by an LO on-chip signal trace 812, and that the output of LNA 362 is coupled to balun 363 by an RF on-ship trace 811. As shown in FIG. 3D, the LO on-chip trace crosses the RF on-chip trace, even though standard RF integrated circuit design practiced would teach that such a crossover should be avoided, because of the risk of the signal on each trace corrupting the signal on the other trace. A structure for implementing such a crossover is schematically illustrated in FIG. 8B.

Front-End

Figure 4A:
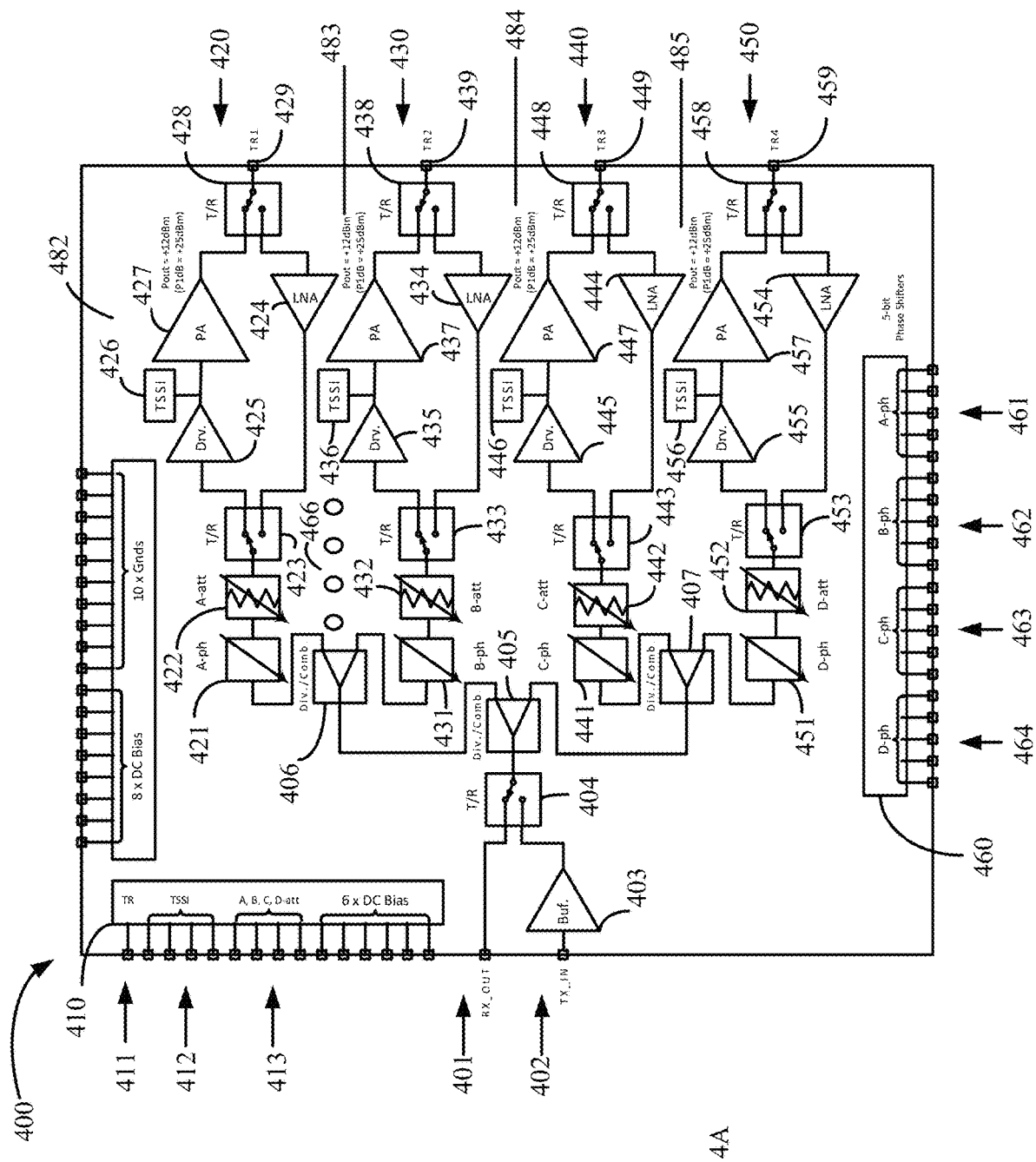
FIG. 4A schematically illustrates an embodiment of a front-end circuit.

FIG. 4A schematically illustrates an illustrative embodiment of a front-end circuit 400. The front-end circuit 400 has four parallel, bidirectional, independently-controllable phase shifted channels 420, 430, 440 and 450, extending between, at one end, four corresponding antenna interface terminals 429, 439, 449 and 449, and at another end, an RX output terminal 401 and a TX input terminal 402.

In a transmit mode, switches 404, 423, 428, 433, 438, 443, 448, 453 and 458 are set to transmit configuration, in response to the mode control signal 510 from the controller 500. With the switches so configured, a radio frequency signal (e.g., from a frequency converter circuit 300) enters the front-end circuit 400 at TX input terminal 402 and passes through switch 404 to a set of divider/combiner circuits 405, 406 and 407 into each of the four phase shifted channels 420, 430, 440 and 450. Phase shifted channel 420 is described below, with the understanding that phase shift channels 430, 440 and 450 are structurally similar and operate in similar fashion, except that each of the phase shifted channels 420, 430, 440 and 450 may be controlled independently to impart the same or a different phase shift on the radio frequency signal. In transmit mode, the signal is divided into four discrete paths (420, 430, 440, 450), each of which imparts an individual phase shift to effect beam steering at the channel's respective antenna port. It should be noted that, in receive mode (discussed below), the phase fronts, respectively, of the incoming signals at the antennas have different phases from one another, and by passing through the phase shifted channels 420, 430, 440, 450, the phases are aligned and the four signals are combined coherently (to sum their respective energies in a combined signal), and the combined signal is passed to a frequency converter (e.g., a receive channel in a frequency converter 300).

Phase shifted channel 420 includes a phase adjuster 421, an attenuator 422 and a mode switching circuit 482.

In preferred embodiments, the phase adjuster 421 preferably has the ability to adjust the phase of a radio frequency signal in a continuous range over at least 360 degrees, and in some embodiments 400 degrees. An embodiment of a phase adjuster 421 is schematically illustrated in FIG. 4C, and includes two independently controllable stages 491 and 492 in electrical series, such that the phase adjustment imparted onto the radio frequency signal is the sum of the phase adjustments imparted by each of the two stages 491, 492. Another embodiment of a two-stage phase shifter 421 is schematically illustrated in FIG. 4D.

The two-stage phase shifter 421 of FIG. 4D is modeled on a phase shifter disclosed in International Publication Number WO 91/20126 (international patent application number PCT/GB91/00892 to applicant Hewlett-Packard Company, titled "Phase Shifting Circuits" by inventor John Domokos).

Referring to FIG. 4D, a phase shifter 421 comprises a first stage 491 having controllable selectable fixed shifters, a second stage 492 having a continuously variable delay line.

The first stage 491 has a plurality of delay lines. In the embodiment of FIG. 4D, the first stage 491 has three delay line sections (14, 15 and 16) which can be switched into or out of a signal path by operation of switches (17, 18, 19, 20, 21 to 22). The switches are operated under the control of the controller 500. For example, control signal 591 may be a multi-bit digital signal, with a first bit to control switches 17 and 18 to switch delay line 14 into and out of the signal path, a second bit to control switches 19 and 20 to switch delay line 15 into and out of the signal path, and a third bit to control switches 21 and 22 to switch delay line 16 into and out of the signal path.

The first stage 491 is coupled to the second stage 492. In some embodiments, the first stage 491 is coupled to the second stage 492 by means of a variable gain amplifier 26.

The second stage 492 includes a plurality of varicap diodes 31, 32 which are connected together to form a lumped element transmission line 33. The capacitance of this line 33 is dependent upon the reverse bias voltage which is applied to each of the varicap diodes 31, 32. This bias being controlled by signals 592 fed from the controller 500.

FIG. 4E schematically illustrates another embodiment of a phase shifter circuit 421 modeled in part on a phase shifter disclosed in U.S. Pat. No. 4,994,773 (titled "Digitally Controlled Monolithic Active Phase Shifter Apparatus Having a Cascode Configuration," by inventors Chen et al.). FIG. 4E schematically illustrates a simple block diagram of a digitally controlled active phase shifter employing vernier control.

An input signal is directed to an input of a 90 degree bit phase shift element 50. The output of the 90 degree bit phase shift element 50 applied to the input of 180 degree bit phase shift element 51. The output of the 180 degree bit phase shift element 51 is applied to the input of the digitally controlled active vector generator 492 which incorporates vernier control.

The fixed 90 degree bit phase shift element 50 and the fixed 180 degree bit phase shift element 51 can be either passive or active networks. The 90 degree bit phase shift element 50 can be a bidirectional phase shifting device as can the 180 degree bit phase shift element 51. The vector generator 492 which is digitally controlled preferably provides phase shifting between 0 to 90 degrees or phase shifting over other ranges as well.

In an illustrative embodiment, a phase shift circuit 421 includes the fixed 90 degree bit phase shift element 50 and the fixed 180 degree bit phase shift element 51 of FIG. 4E, and a the bypass lines 11 and 12, switches 17, 18, 19 and 20 to controllably switch phase shift elements 50 and 51 into and out of the signal path, along with continuously variable phase shift circuit 492 of FIG. 4D.

As described above, it will be understood that the phase adjuster 421 is bidirectional, in that a signal may propagate through the phase adjuster 421 from node 10 to node 39, or from node 39 to node 10. In preferred embodiments, the phase adjuster 421 preferably has the ability to adjust the phase of a radio frequency signal in a continuous range over at least 360 degrees, and in some embodiments 400 degrees. In the embodiment of a phase adjuster 421 schematically illustrated in FIG. 4D, the two stages 191 and 192 are in electrical series, such that the phase adjustment imparted onto the radio frequency signal is the sum of the phase adjustments imparted by each of the two stages 191, 192.

Each discrete phase shifters 491 may be referred-to as N-path phase shifter, where "N" indicates the number of discrete transmission lines. The embodiment of FIG. 4D has four transmission lines, so that N=4, and the discrete phase shifter 191 may be referred-to as a 4-path phase shifter. Specifically, the transmission lines 14, 15, and 16 each impart a delay, and a transmission line consisting of shunts 11, 12 and 13 impart no delay.

The embodiment of FIG. 4E has two transmission elements 50, 51 that can be controlled to impart 90 degrees of phase shift and 180 degrees of phase shift, respectively, so that by they can impart phase shifts of 90 degrees (element 50), 180 degrees (element 51), 270 degrees (element 50 plus element 51), or zero degrees.

Consequently, for example, the four transmission lines of the illustrative phase shifter 191 may impart, respectively, phase shifts 90 degrees, 180 degrees, 270 degrees, and of zero degrees.

Also, as described above, it will be understood that the phase shifter 492 is a continuous phase shifter that can be controlled to impart a phase shift of any angle within its range. For example, in an illustrative embodiment a continuous phase shifter 492 may have a range of 90 degrees, and may impart a phase shift of any angle from 0 degrees to 90 degrees, inclusive. In another illustrative embodiment, a continuous phase shifter 492 may have a range of 100 degrees, and may impart a phase shift of any angle from 0 degrees to 100 degrees, inclusive.

In some embodiments, the composite phase range of the two stages 491 and 492 is 360 degrees. In some embodiments, the composite phase range of the two stages 491 and 492 is 400 degrees.

The following table illustrates the total phase adjustment range of an illustrative embodiment of a phase adjuster 421 in which the discrete phase shifter 491 is a 4-path phase shifter, and the continuous phase shifter 492 has a continuous range of 90 degrees:

| Discreet Setting | Continuous shifter range | Total range |
| --- | --- | --- |
| 0 degrees | 0-90 degrees | 0-90 degrees |
| 90 degrees | 0-90 degrees | 90-180 degrees |
| 180 degrees | 0-90 degrees | 180-270 degrees |
| 270 degrees | 0-90 degrees | 270-360 degrees |

The following table illustrates the total phase adjustment range of another illustrative embodiment of a phase adjuster 421 in which the discrete phase shifter 491 is a 4-path phase shifter, and the continuous phase shifter 492 has a continuous range of 100 degrees:

| Discrete Setting | Continuous shifter range | Total range |
| --- | --- | --- |
| 0 degrees | 0-100 degrees | 0-100 degrees |
| 100 degrees | 0-100 degrees | 100-200 degrees |
| 200 degrees | 0-100 degrees | 200-300 degrees |
| 300 degrees | 0-100 degrees | 300-400 degrees |

The foregoing phase shift architectures yield lower overall attention (i.e., lower overall loss) and much smaller size than a system with a single (e.g., N-bit) phase shifter. Consequently, the phase shift architecture of illustrative embodiments is less complex than other options, and smaller, thus yielding considerable real-estate savings in the integrated circuit 400.

In some embodiments, the phase adjuster 421 attenuates the radio frequency signal, and in some embodiments, the amount of such attenuation may depend on the settings of the at least one of the phase shifters 491 and 492. In some embodiments, it may be desirable to have a constant attenuation. To that end, the attenuator 422 may be controlled, e.g., via attenuator control signal 522 from the controller 500, to change its attenuation in concert with the settings of the phase shifters 491 and 492 so that the combined attention of the attenuator 422 and the phase shifters 491 and 492 is constant for all settings of the phase shifters 491 and 492.

To that end, preferred embodiments adjust the phase adjuster 421 via a look-up-table (LUT) which may be stored in the memory 501 of controller 500. The look-up-table specifies the settings of the phase adjuster (e.g., one or both of its constituent parts 491 and 492) based not only on the gain of the system and the desired phase shift, but also on the frequency of the signal on which the phase adjuster operates, and on temperature of the phase adjuster. That is, the input parameters commanded to the phase adjuster LUT, in preferred embodiments, consists of GAIN, PHASE, FREQ, and TEMP. The phase adjuster LUT optionally may consist of individual look-up values OR an EQUATION of best-fit to reduce LUT size.

Here, the inventors note that, since both phase shifters 491, 492 and attenuators 422 are controlled by the controller 500, the system 200 can program every state of the phase shifters 491, 492 and attenuators 422 simultaneously. In terms of the overall system, all four channels of phase shifters and attenuators can be programmed coincidentally to steer the antenna beam effectively instantaneously. This is in contrast to other conceivable options, such as the use of serial addressing (i.e., to reduce the number of I/O pins), but such an approach would be slower (i.e., it would slow down programming)—sometimes quite dramatically which undesirably limits fast-switching (i.e. beam steering).

In illustrative embodiments, the mode switching circuit 482 includes a receive branch having a low noise amplifier 424, and in parallel with the receive branch, a transmit branch having a driver 425 in series with a power amplifier 427.

In transmit mode, a pair of switches 423, 428 direct an outgoing radio frequency signal through the driver 425 and power amplifier 427.

In receive mode, the pair of switches 428, 423 at opposing ends of the mode switching circuit 482 direct an incoming radio frequency signal through the low noise amplifier of the receive branch.

In some embodiments, the power amplifier 427 is a high-performance power amplifier that draws an un-sustainable quantity of power, meaning that if the power amplifier 427 were powered with a 100 percent duty cycle, it service lifetime would be shortened, and/or the power amplifier 427 or integrated circuit 400 would be damaged from heat generated by the power amplifier 427. Consequently, in preferred embodiments, the power amplifier 427 is operated at a duty cycle less than 100 percent, and preferably less than 30 percent, or 20 percent. Such operation is possible because the transceiver 200 operates in TDD mode, and the power amplifier 427 can be powered-off when the transceiver 200 is in receive mode. It is known in the art that an integrated circuit has a heat tolerance above which the integrated circuit may be damaged, or above which the operational lifetime of the integrated circuit will be reduced. Therefore, in addition to reducing power draw, operating the power amplifier 427 at a duty cycle less than 100 percent (e.g., 20 percent; 30 percent) increases the operational lifetime of the power amplifier 427, and therefore the integrated circuit of which it is a part, by preventing the temperature of the power amplifier 427 from reaching/operating at levels that would damage the integrated circuit or reduce its lifetime.

In some embodiments, the mode switching circuit 482 may have an asymmetric loss profile. In the prior art, good design practice dictates that a switch in a transceiver have a symmetric loss profile—that is, the insertion loss for a signal traveling from the pole to one of the throws of a single-pole double-throw ("SPDT") switch be the same as the insertion loss for a signal travelling from the other throw of the SPDT switch to the pole. Following that convention is beneficial because a switch with a symmetric loss profile provides reduced cross-talk.

In contrast to that convention, illustrative embodiments of one or more of the switches 428, 423 have an asymmetric loss profile in that the insertion loss of an incoming signal at one throw 620, when that throw 620 is coupled to the pole 610, is greater than the insertion loss of an outgoing signal at the pole 610 when the pole 610 is electrically coupled to the second throw 630.

The mode switching circuit 482 optionally includes a transmit signal strength indicator ("TSSI") circuit 426 electrically coupled at a node between the driver 425 and power amplifier 427. Convention dictates that a TSSI circuit be disposed at the output of a signal chain so as to measure the signal in its final form. In other words, ideally, a TSSI circuit would measure power directly at the output, since that point gives the most accurate reading of power actually being output to an antenna. The inventors have realized, however, that measuring power directly at the output imposes a cost to system performance in that measuring the output signal actually attenuates it, resulting in a diminution of output power.

In contrast to convention and the ideal, illustrative embodiments dispose the TSSI circuit one or more nodes upstream from the output of the signal chain. A benefit of this approach is that is avoids wasting of up to 0.5 dB of transmit output power or 0.5 dB higher NF in receive mode. Preferred embodiments use the relative calibration scheme to accommodate this benefit. Although the foregoing approach may result in a loss of accuracy (relative to the disposing the TSSI circuit at the output), the inventors find, for purposes of embodiments described herein, that such a loss is acceptable given the benefit of avoiding the loss of valuable RF performance as stated above.

Figure 4B:
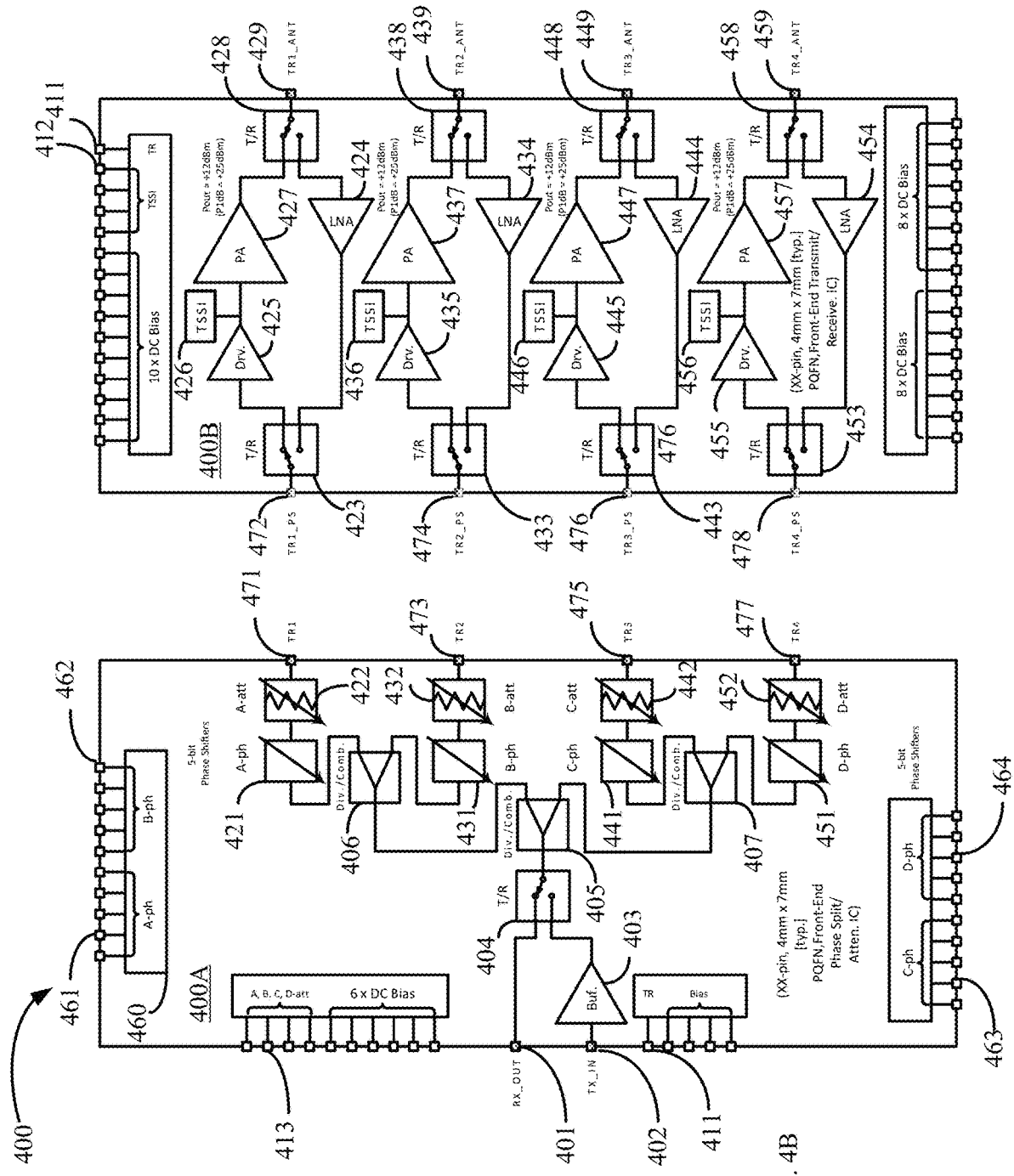
FIG. 4B schematically illustrates another embodiment of a front-end circuit.

FIG. 4B schematically illustrates an alternate embodiment of a front-end circuit 400 in which the circuit is disposed on two different integrated circuits 400A and 400B. The two integrated circuits may be coupled together via intermediate terminals (intermediate terminal 471 coupled to intermediate terminal 472, for example by a wire-bond; and similarly 473 to 474, 475 to 476, and 477 to 478) to operate as described above for the embodiment of FIG. 4A. However, distributing the circuitry across two integrated circuits allows some embodiments to include a third circuit (e.g., a filter) electrically between the intermediate terminals of two integrated circuits 400A and 400B.

The foregoing embodiments generate heat when in operation, and so preferred embodiments include backside heat-sinking. Additionally, to mitigate the risk of oscillation, preferred embodiments include isolation features. These two needs are met in preferred embodiments with row of topside vias 466 disposed between the channels. Such vias 466 both improve channel-to-channel RF isolation and provide additional top-to-bottom thermal via paths to conduct excess heat away from the topside power FETs. Since most heat is primarily dissipated by conduction to the chip's backside metallization, these vias 466 conveniently provide this dual benefit.

As shown in FIG. 4A and FIG. 4B, the front-end circuits 400, 400A and 400B include electrical interfaces to communicate with the controller 500. More specifically, the front-end circuits include a first control interface 410 that includes a T/R interface 411 to receive the mode signal 510, TSSI terminals 412 to communicate TSSI data; attention terminals 413 to receive attenuation control signals. The front-end circuits also include a phase control interface 460 with terminals 461, 462, 463 and 464 to receive, respectively, control signals 591 and 592 for the phase adjuster circuit 421, 431, 441 and 451. The front-end circuits may thus be said to be control communication with the controller 500.

Figure 5A:
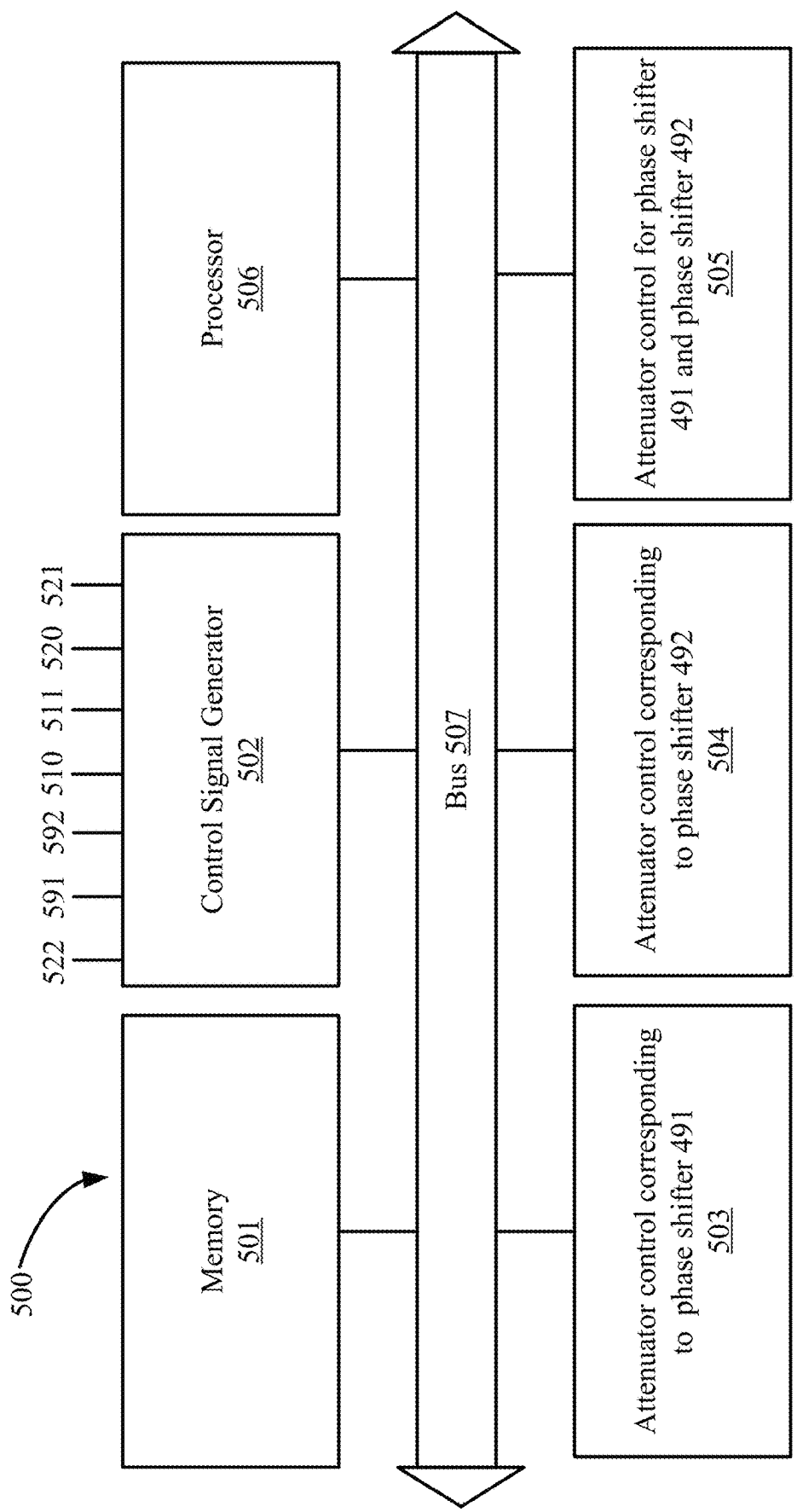
FIG. 5A schematically illustrates an embodiment of a controller.
Figure 5B:
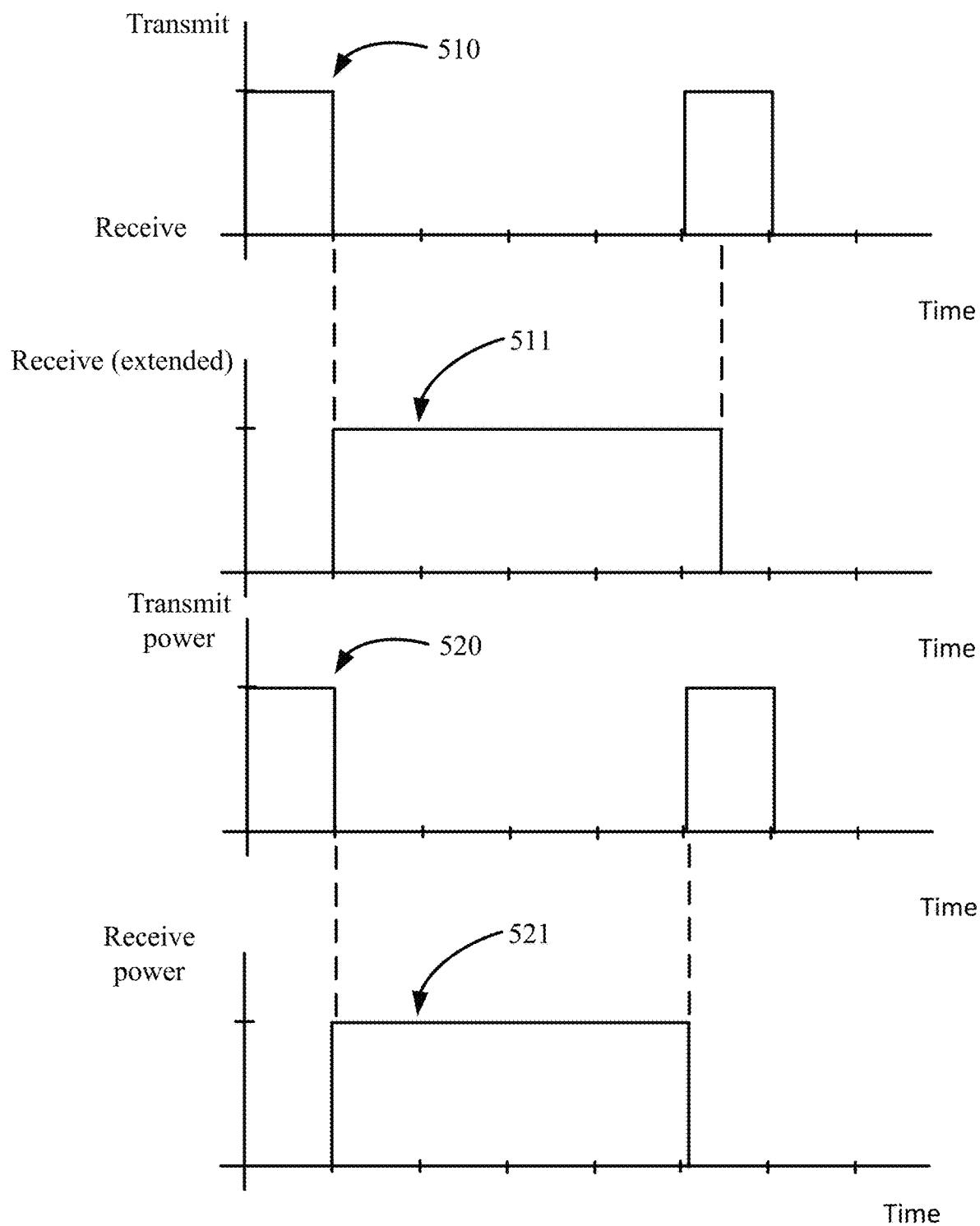
FIG. 5B schematically illustrates embodiments of control signals.

FIG. 5A schematically illustrates a controller circuit 500, and FIG. 5B schematically illustrates control signals that may be generated by the controller circuit 500.

The controller 500 includes a control signal generator for producing the various control signals described above. Controller 500 also includes an attenuator controller 503 configured to control the attenuator 422 according to the setting of the first phase shifter 491, and another attenuator controller 504 configured to control the attenuator 422 according to the setting of the first phase shifter 492. Preferred embodiments include an attenuator controller 505 configured to control the attenuator 422 by simultaneously taking into account the settings of both the first phase shifter 491 and the second phase shifter 492. The controller 500 also includes a memory 501 for storing look-up tables and other information, as well as code for execution on processor 506. Processor 506 is in data and control communication with the modules 501-505 described above, via bus 507.

Mode signal 510 controls the system 200 to be in transmit mode (signal high) or receive mode (signal low). Extended receive channel mode signal 511 changes some discrete time after mode signal 510 changes to transmit mode, to allow a second receive channel 320 (FIG. 3B) to remain active for a short time as the transmit channel 340 comes on-line (as described above).

Signal 520 is a transmit power-control signal that powers-on one or more circuit elements (signal high) when the system 200 is in transmit mode, and powers-off those circuit elements (signal low) when the system 200 is not in transmit mode.

Signal 521 is a receive power-control signal that powers-on one or more circuit elements (signal high) when the system 200 is in receive mode, and powers-off those circuit elements (signal low) when the system 200 is not in receive mode.

As mentioned above, some embodiments turn-off power to some circuit elements (e.g., each a power-consuming device) in some operating modes. To that end, FIG. 6B schematically illustrates a power control circuit 650 responsive to a control signal 654 from the controller 500 (e.g., transmit power-control signal 520 or receive power-control signal 521). When powered-on, the power-consuming device 651 draws power from power source 652 through power interrupter (e.g., on/off switch) 653. When powered-off, the power interrupter 652 does not allow power from power source 652 to reach the power-consuming device 651.

Figure 7A:
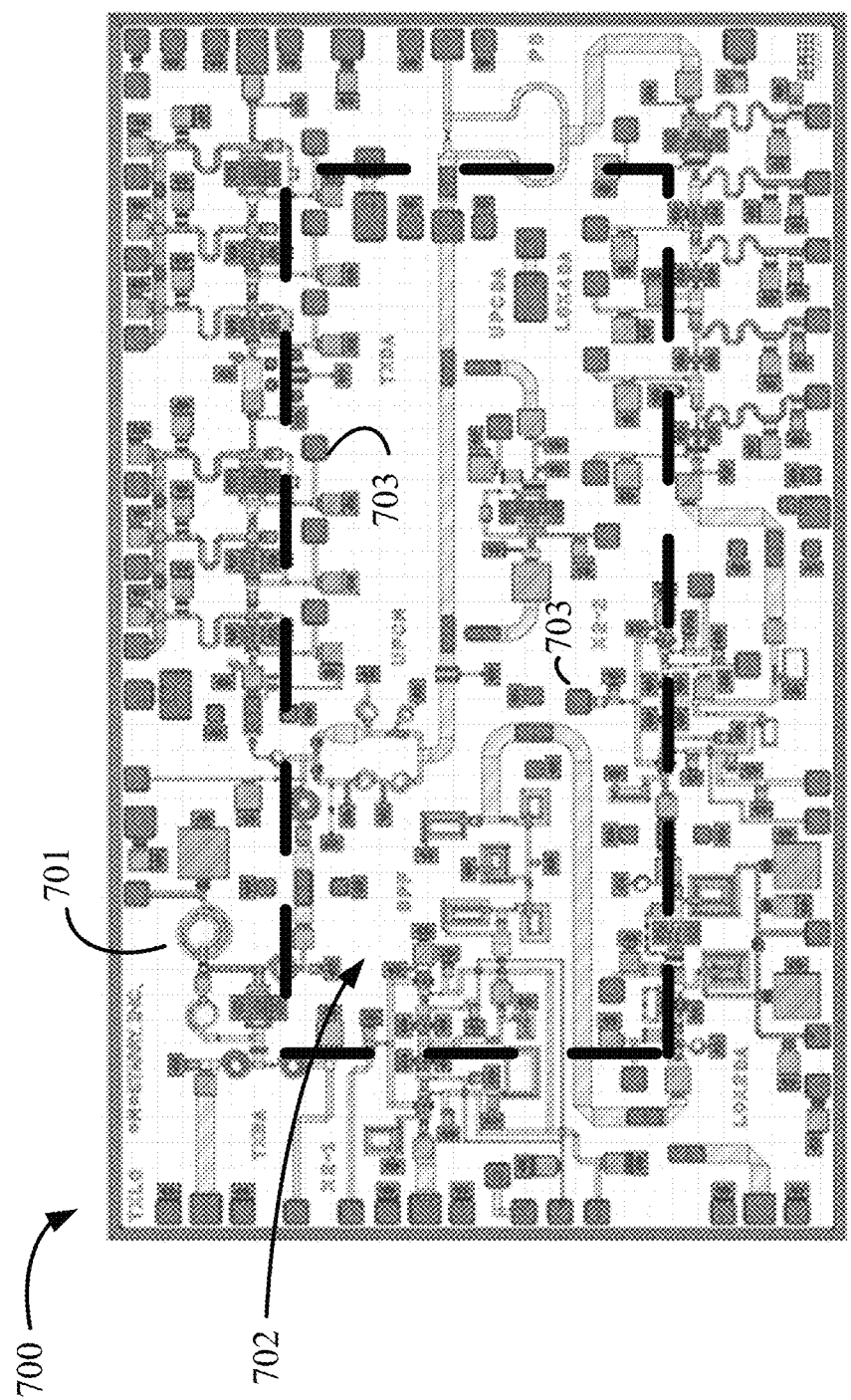
FIG. 7A schematically illustrates a layout and features of an embodiment of a frequency up-conversion integrated circuit.

FIG. 7A schematically illustrates a layout and features of an embodiment of a frequency up-conversion integrated circuit 700 having a top surface 701. In addition to the circuits described above, some embodiments include one or more internally-disposed bond pads 703, each of the internally-disposed bond pads disposed on an interior portion 702 of a top surface of the integrated circuit. The interior portion 702 may be defined from the geometric center of the top surface, and encompasses at least twenty percent of the top surface extending from the geometric center of the top surface, but not extending to an edge of the integrated circuit. In illustrative embodiments, the interior portion 702 has a quadrilateral shape having a center point co-located with the geometric center point of the integrated circuit 700. In FIG. 7A, the quadrilateral is illustrated as a dashed line, but it should be understood that the dashed line is not a physical part of the integrated circuit 700, but is instead included only to indicate the boundaries of the interior portion 702. In other embodiments, the interior portion may occupy 30 percent, 40 percent, 50 percent, 60 percent, or 70 percent or 80 percent of the surface, to name but a few examples.

In other embodiments, a bond pad disposed in an interior portion may defined as a bond pad that does not have at least one edge on the perimeter of the integrated circuit, or as a bond pad that is disposed inwardly, from the nearest edge of the integrated circuit, from other structures on the surface of the integrated circuit (in other words, a bond pad disposed in an interior portion may be defined as a bond pad that has other structures between the bond pad and the nearest edge of the integrated circuit).

Figure 7B:
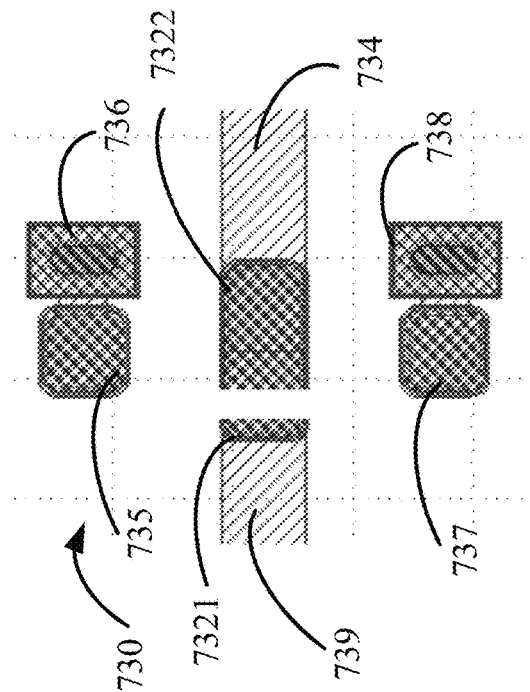
FIGS. 7B and 7C schematically illustrate an embodiment of a severable probe pad system.
Figure 7D:
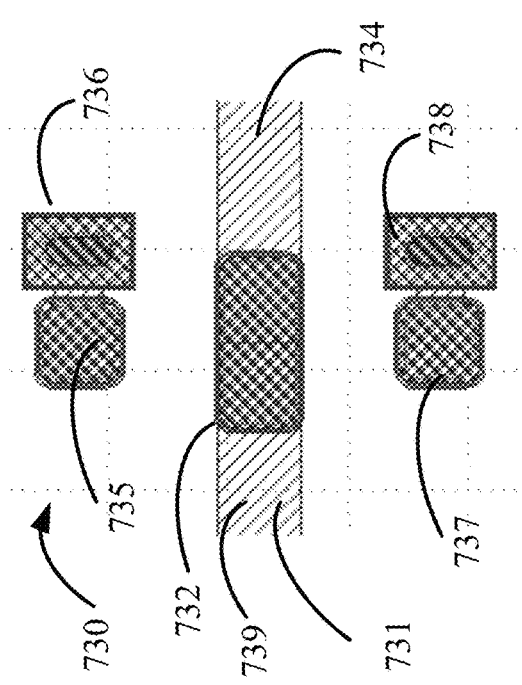
FIGS. 7D and 7E schematically illustrate an embodiment of a selectable impedance.
Figure 7C:
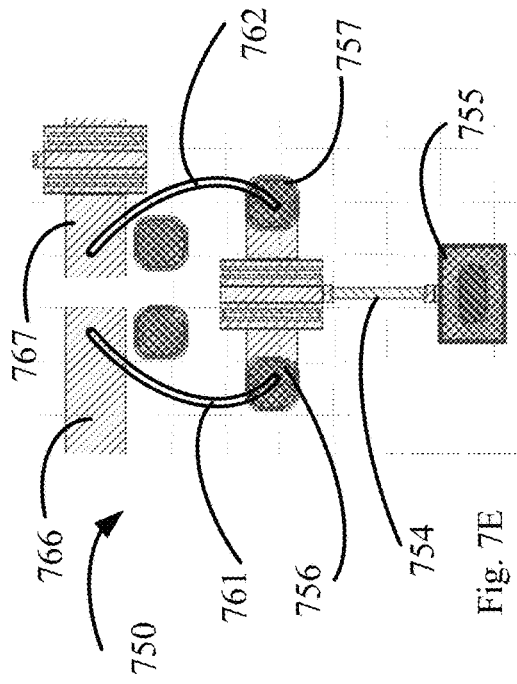

FIGS. 7B and 7C schematically illustrate an embodiment of a severable probe pad system. FIG. 7B schematically illustrates a ground-signal-ground terminal set 730. Ground pad 735 and ground pad 737 are electrically coupled to ground, and signal pad 732 is electrically coupled to trace 731. This signal pad 732 has a center that aligns (i.e., is in line with) ground pads 735 and 737. Moreover, the signal pad 732 is disposed relative to the ground pads 735 and 737 such that the three terminals 876, 877, 878 of a three-terminal probe 875 (e.g., FIG. 8I) can simultaneously contact, respectively, the ground pad 735, the signal pad 732 and the ground pad 737. In illustrative embodiments, the signal pad 732 may be severed to divide the signal pad 732 into two isolated parts, 7321 and 7322 (and if the trace 731 is on the surface of the integrated circuit, then also divide the trace 731 into two electrically isolated parts 734 and 739), as schematically illustrated in FIG. 7C. The signal pad 732 has a length that is sufficiently long that it may be severed near a first end, and the second end of the signal pad (portion 7322), which is connected to one of the isolated parts of the signal trace 731, still forms a line with the two ground pads 735, 737, as schematically illustrated in FIG. 7C. In preferred embodiments, the signal pad 732 has a length that is sufficiently long that it may be severed near the second end, and the first end of the signal pad which is connected to the other of the isolated parts of the signal trace 731, still forms a line with the two ground pads 735, 737. In this way, a test system operator may sever the signal pad 731 (and the signal trace 731), and still probe one isolated segment of the signal trace 731 with a three-terminal probe 875. Moreover, in preferred embodiments, the terminal set 730 is disposed at a clearing on a top surface of the integrated circuit. The clearing is free of obstructions, such as bond wires or connectors or other structures that would impede or prevent access by the terminals of a three-terminal probe to the pads 735, 732 and 737, and thereby allows probe access to the top surface of the integrated circuit and the pads.

Figure 7E:
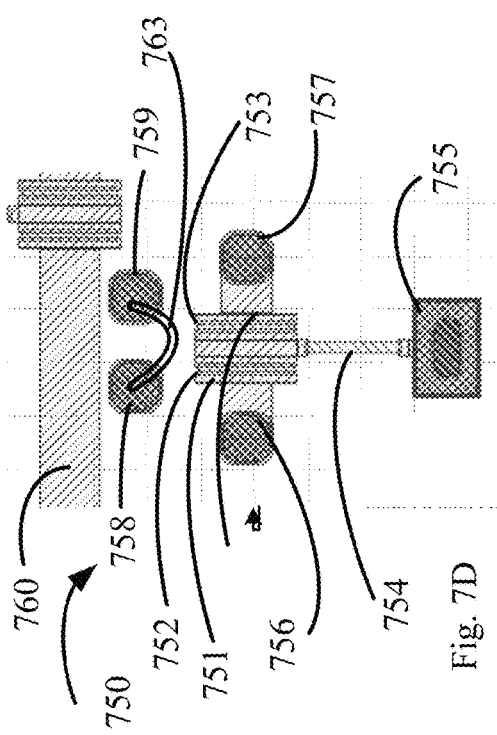

FIG. 7D and FIG. 7E schematically illustrate an embodiment of an attenuator structure 750 (e.g., a 1 dB attenuator) that may be selectively coupled to a signal trace 760. The attenuator structure 750 in this embodiment may be referred-to as a "Tee-attenuator," but other embodiments may use other attenuator structures, such as a "Pi-attenuator" for example.

The attenuator structure 750 in FIG. 7D and FIG. 7E has two resistors 751 and 753 coupled to each other at a node 752 in between them. A third resistor 754 couples the node 752 to ground 755. Two bond pads, 758 and 759, are disposed adjacent to the signal trace 760 and the attenuator structure 750. The bond pads 758 and 759 are thus selectively connectable to the segments 760 and 767 so that the resistors 751, 752 and 754 act as tuning elements to compensate for possible impedance mismatch on the transmission line 760.

In FIG. 7D, the attenuator structure 750 is electrically isolated from the signal trace 760.

In FIG. 7E, the signal trace 760 has been severed by a gap between segments 766 and 767, and attenuator structure 750 is electrically coupled across the gap. Specifically, a first wire bond 761 couples segment 766 to bond pad 756, and a second wire bond 762 couples segment 767 to bond pad 755. Consequently, the attenuator structure 750 is electrically in series between segment 766 and 767, and supplies an attenuation to a signal propagating between those segments.

To remove such an attenuator (e.g., resistors) from the circuit, wire bonds 761 and 762 may be removed from bond pads 756 and 757, and coupled to (or replaced with other wire bonds coupled to) bond pads 758 and 759, respectively, and third wire 763 bond may be coupled between bond pad 758 and bond pad 759, so that a signal propagating on segment 766 may propagate through wire bond 761 to bond pad 758, and then through the third wire bond to bond pad 759, and then via wire bond 762 to segment 767.

It should be noted that, although FIG. 7D and FIG. 7E show structures configured to allow resistors 751, 752 and 754 to be selectively coupled to the transmission line 760, other embodiments use those structures to couple other circuit elements to transmission line 760, such as capacitors, inductors, or filters connected in series or shunt fashion for the express purpose of impedance matching and/or oscillation prevention or suppression.

Figure 8A:
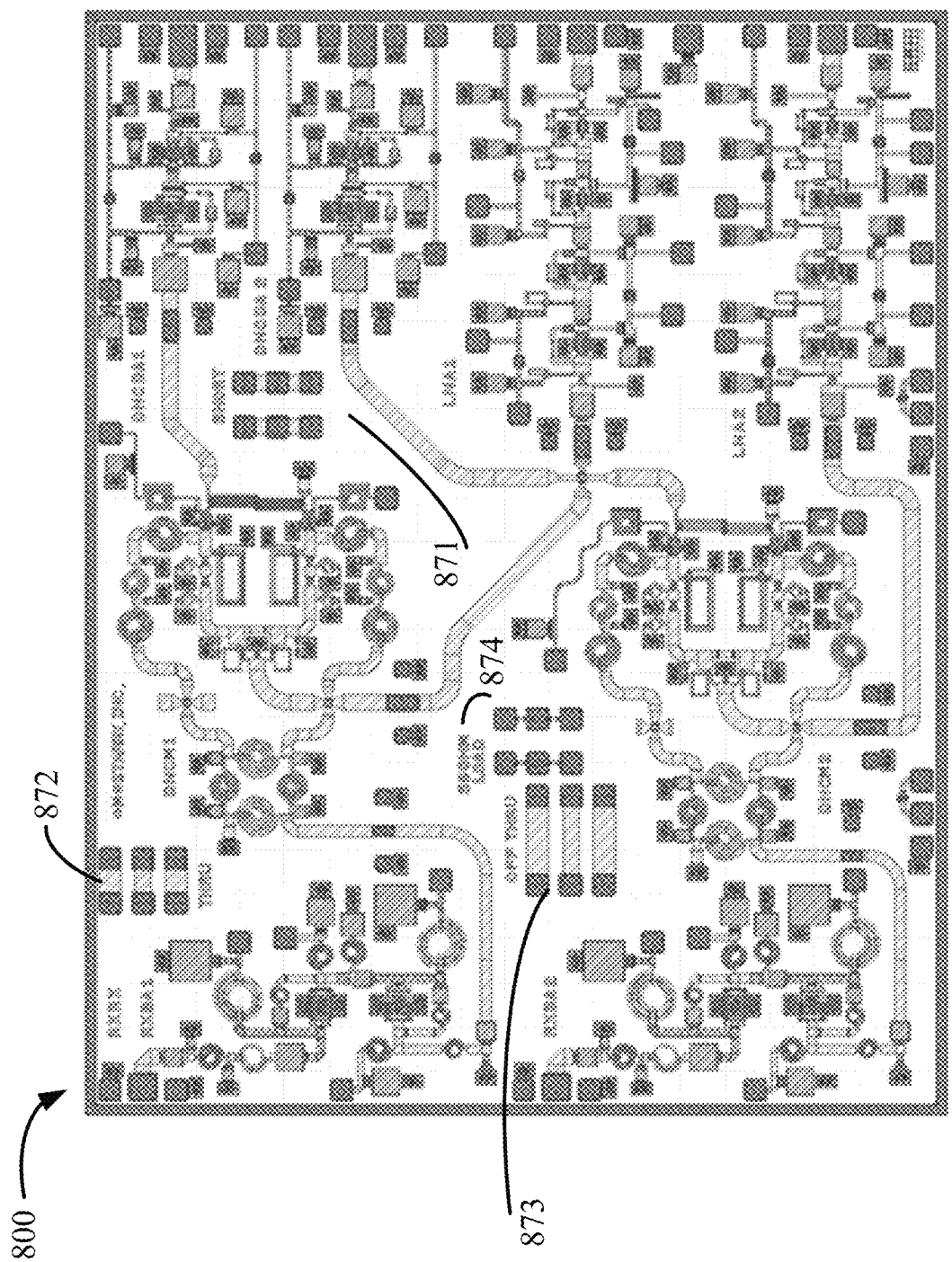
FIG. 8A schematically layout of an embodiment of a frequency down-conversion integrated circuit.

FIG. 8A schematically layout of an embodiment of a frequency down-conversion integrated circuit 800.

Figure 8D:
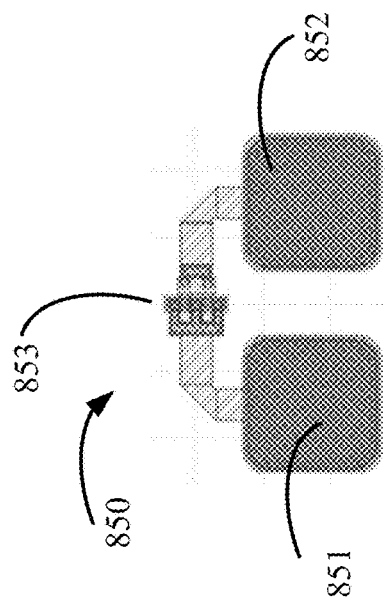
FIG. 8B, FIG. 8C and FIG. 8D each schematically illustrates a feature of an embodiment of a frequency down-conversion integrated circuit.
Figure 8B:
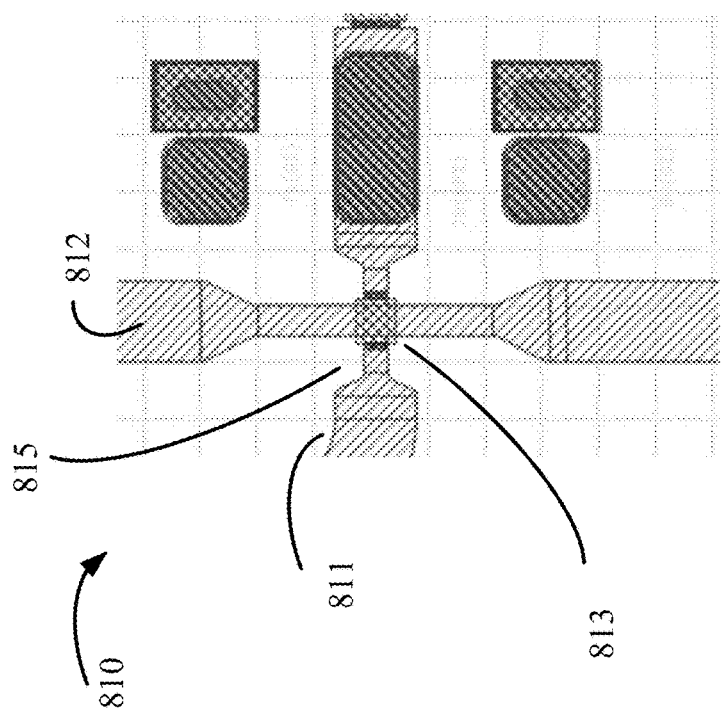
Figure 8C:
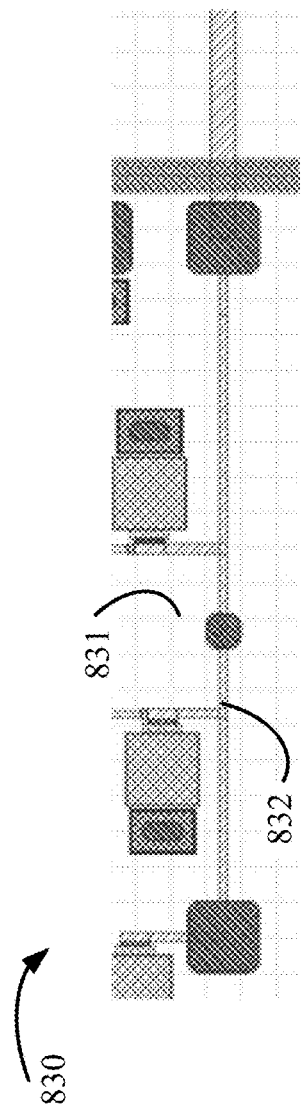

FIG. 8B, FIG. 8C and FIG. 8D each schematically illustrates a feature of an embodiment of a frequency down-conversion integrated circuit;

FIG. 8B schematically illustrates a crossover structure 815 by which on-chip RF signal trace 811 crosses over on-chip LO signal trace 812 (or in some embodiments, the on-chip LO signal trace 812 crosses over the on-chip RF signal trace 811). The two traces 811, 812 are separated at the point of crossover by one or more intervening insulator layers 813, such as silicon dioxide for example. The structure 815 may be thought of as a trace-insulator-trace sandwich. As illustrated, the RF signal trace 811 has a first width (in or parallel to a plane formed by a top surface of the integrated circuit 390), and the LO trace 812 has a second width. At the point of crossover, however, the width of each such trace is narrower. In other words, the RF signal trace 811 has a third width that is less than the first width, and the LO signal trace 812 has a fourth width that is less than the second width. In this way, capacitance between the RF signal trace 811 and the LO signal trace is reduced, relative to what the capacitance would have been if the traces maintained the first and second widths, respectively. In illustrative embodiments, the third and fourth widths are 60 percent, or 50 percent, or 40 percent of the first and second widths, respectively, to name but a few examples.

FIG. 8C schematically illustrates a portion of a circuit 830 that includes a severable pad 831 electrically coupled to a bias trace 832. The severable pad 831 may be cut or severed, for example by an operator, so that a circuit coupled to the bias trace 832 may be biased by providing a DC voltage to one end of the severed pad 831. The severable pad 831 has a dimension long enough so that it may be severed into two portions, and at least one, and preferably both of the severed portions, are sufficiently large to receive a probe or bond wire to deliver to the severed portion, and the bias trace 832 coupled to the severed portion, a DC bias voltage.

FIG. 8D schematically illustrates an integrated circuit temperature sensor 850, including a voltage supply pad 852 coupled to an on-chip power supply, and a ground pad 851 coupled to chip ground. A diode 853 is coupled between the voltage supply pad 852 and the ground pad 851. As known in the art, current through a diode (e.g., diode 853) varies as a function of diode temperature. Consequently, current flow through diode 853 is indicative of chip temperature, and may be characterized by voltage across the diode. The temperature sensor 850 is operably coupled to the controller 500, which monitors that current flow (or voltage) to determine chip temperature, and the controller 500 in some embodiments then uses that chip temperature to control other functions of the integrated circuit, such as amplifier gain for example.

FIG. 8E, FIG. 8F, FIG. 8G and FIG. 8H each schematically illustrates an embodiment of two-port on-wafer calibration standards: short circuit 871), through-line (872), offset through-line (873), and matched load impedance (e.g., 50 ohms) (874). Some embodiments of a frequency downconverter circuit (e.g., 390) include one or more on-chip calibration references. Such calibration references are known in the art. As shown and described, each of the two-port on-wafer calibration standards is architecturally distinct from the others.

FIG. 8I schematically illustrates a three-terminal RF probe 875, as known in the art (ground-signal-ground), for example for probing a set of terminals. The probe 875 has three terminals 876, 877, 878. These terminals form a straight line so that they can simultaneously contact a wafer on a single reference plane.

FIG. 8J schematically illustrates a semiconductor wafer 880 having a plurality of individual integrated circuits 881 (e.g., downconverter circuits 390). At least half of the individual integrated circuits 881 on the wafer 880 include a plurality of on-ship calibration references, even though wafer design practice holds that such calibration references be limited to areas of the wafer that are not production integrated circuits, or that only a few of the integrated circuits include calibration references. In alternative embodiments, 60 percent of the individual integrated circuits 881 on the wafer 880 include a plurality of on-ship calibration references, and in some embodiments that number is 70 percent, 80 percent, or 90 percent, or 100 percent.

Figure 9A:
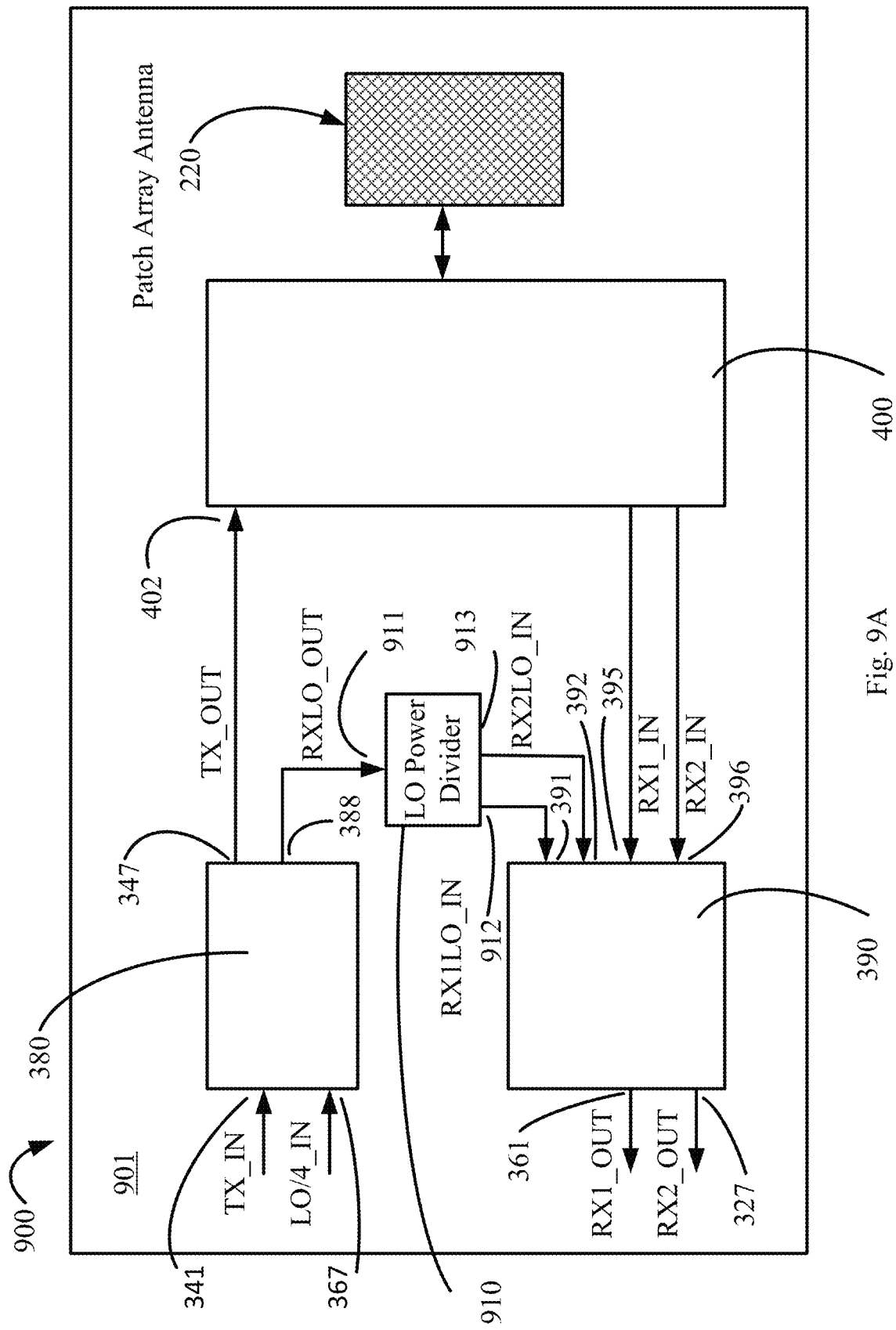
FIG. 9A schematically illustrates an embodiment of a transceiver chip system.

FIG. 9A schematically illustrates an embodiment of a transceiver chip system 900 on a printed circuit board substrate 901. This embodiment includes a frequency upconverter integrated circuit 380 and a frequency downconverter circuit 390, coupled with one or more front-end circuits 400, which may be for example any of the front-end circuits disclosed herein (e.g., in FIGS. 4A, 4B and 4C). The system 900 also includes an off-chip local oscillator power divider 910.

The off-chip LO power divider 910 has an input terminal 911 is coupled to the LO output terminal of the upconverter circuit 380, a first off-chip divider output 911 operably coupled to the first receive LO input terminal of the downconverter circuit 390, and a second off-chip divider output 913 operably coupled to the second receive LO input terminal of the downconverter circuit 390. The receive signal output terminals of the front-end circuit(s) 400 are coupled to the receive input terminals of the downconverter circuit 390. The front-end circuit(s) 400 is coupled to a patch array antenna 220.

Figure 9B:
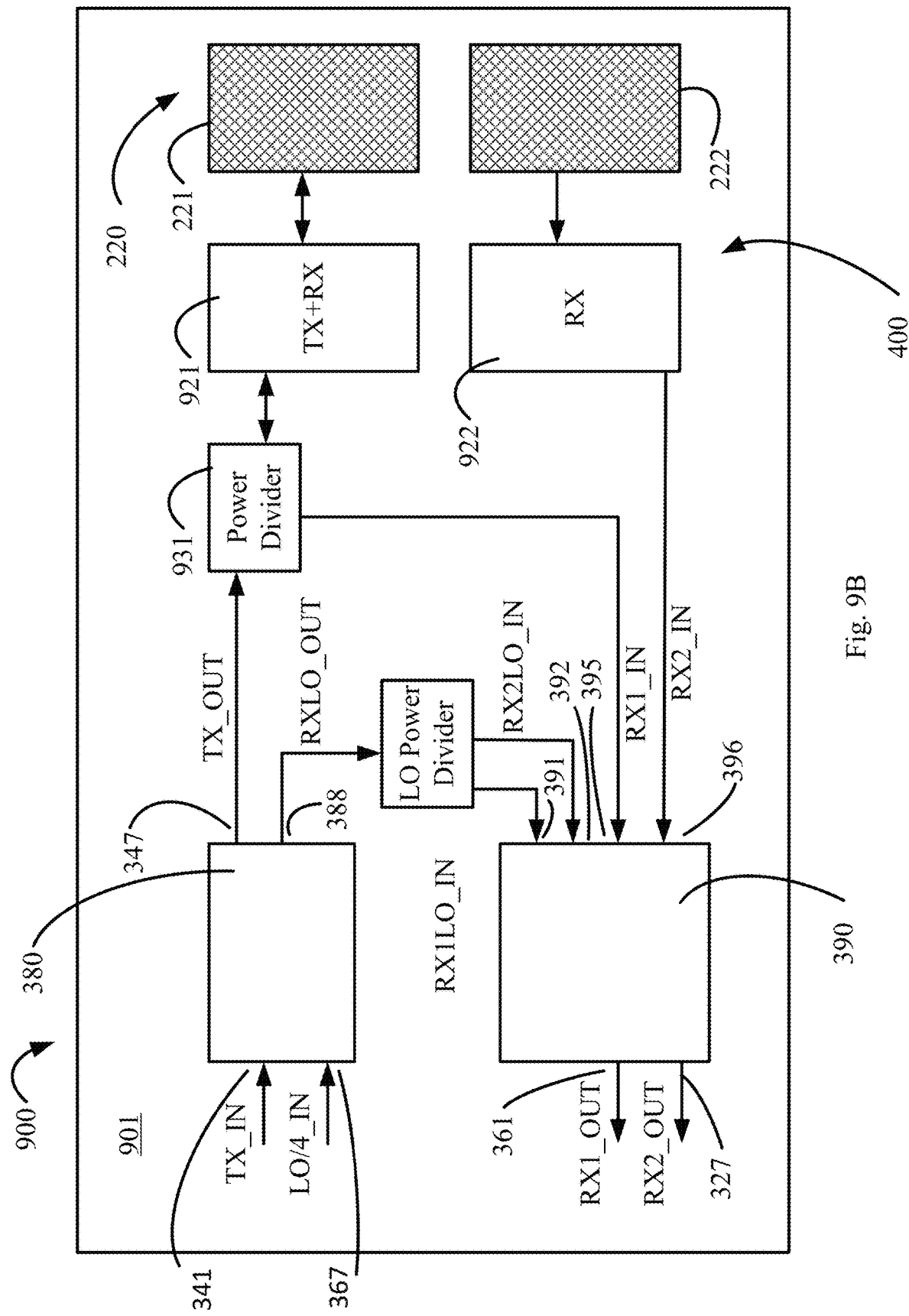
FIG. 9B schematically illustrates an embodiment of a transceiver chip system.

FIG. 9B schematically illustrates another embodiment of a transceiver chip system on a printed circuit board substrate 901. In this embodiment, the front end 400 includes two distinct sets of integrated circuits 921 and 922. Set 921 includes one or more integrated circuits that include both receive and transmit signal chains. The transmit channels of set 921 are coupled to the upconverter circuit 380 through a power divider 931, and the receive channels of set 921 are coupled to the downconverter circuit 390 through that power divider 931. The integrated circuits of set 921 are coupled to a patch array antenna 221.

In contrast, set 922 includes one or more integrated circuits that include only receive signal chains. Because those integrated circuits do not receive a transmit signal, the integrated circuits of set 922 are coupled to the downconverter circuit 390 without passing through an intervening power divider. The integrated circuits of set 921 are coupled to another patch array antenna 922. Patch array antenna 221 and patch array antenna 922 collectively form antenna array 220.

As described above, illustrative embodiments have two receive channels for each transmit channel. In some embodiments, the two receive channels may be coupled to different antennas (or different elements of an antenna array 220). In one embodiment of operation, each receive channel receives a signal that is distinct from the signal received by the other channel. In this way, the system can process independent received signals.

In another embodiment of operation, the different antennas are configured to receive vertically polarized signals and horizontally polarized signals, respectively. Such systems are more robust in that if one signal (e.g., the horizontally-polarized signal or the vertically-polarized signal) is weak, corrupted, blocked or otherwise insufficient for communication, the other (e.g., the vertically-polarized signal or the horizontally-polarized signal) may continue the communication through its associated receive channel. In such a system, the first receive channel and the second receive channel may be described as being associated with one another and with the transmit channel.

The embodiments of the invention described above are intended to be merely exemplary; numerous variations and modifications will be apparent to those skilled in the art. All such variations and modifications are intended to be within the scope of the present invention as defined in any appended claims.

Various embodiments may be characterized by the potential claims listed in the paragraphs following this paragraph (and before the actual claims provided at the end of this application). These potential claims form a part of the written description of this application. Accordingly, subject matter of the following potential claims may be presented as actual claims in later proceedings involving this application or any application claiming priority based on this application. Inclusion of such potential claims should not be construed to mean that the actual claims do not cover the subject matter of the potential claims. Thus, a decision to not present these potential claims in later proceedings should not be construed as a donation of the subject matter to the public.

Without limitation, potential subject matter that may be claimed (prefaced with the letter "P" so as to avoid confusion with the actual claims presented below) includes:

I. Topaz {Frequency Converter}

A. The Switched LO

P1. A frequency converter integrated circuit operable in a transmit mode and a receive mode, the circuit comprising: a receive input; a receive output; a receive channel operably coupled between the receive input and the receive output, the receive channel comprising a receive mixer; a transmit input; a transmit output; a transmit channel operably coupled between the transmit input and the transmit output, the transmit channel comprising a transmit mixer; a local oscillator source configured to provide an LO signal; and an LO switch having an input coupled to the local oscillator source, a first output coupled to the receive mixer, and a second output coupled to the transmit mixer, the LO switch configured, in a receive configuration, to controllably couple the LO signal to the receive mixer, and in a transmit configuration to couple the LO signal to the transmit mixer such that the LO is coupled to only one of the receive mixer or the transmit mixer at a time.

P2. The frequency converter integrated circuit of P1, further comprising a low-noise amplifier operably coupled between the receive input and the receive mixer, the low-noise amplifier controllably operable in a powered mode and an unpowered mode, the low-noise amplifier in the powered mode when the LO signal is coupled to the receive mixer, and in the unpowered mode when the LO signal is not coupled to the receive mixer.

P3. The frequency converter integrated circuit of P1, further comprising a mode controller in control communication with the LO switch to control the LO switch to change between the receive configuration and the transmit configuration.

P4. The frequency converter integrated circuit of P3, wherein the mode controller is in control communication with the low-noise amplifier to change between the powered mode and the unpowered mode, such that the low-noise amplifier changes between the powered mode and the unpowered mode contemporaneously with the change of the LO switch between the receive configuration and the transmit configuration.

P5. The frequency converter integrated circuit of P1, wherein the local oscillator source comprises an on-chip oscillator.

P6. The frequency converter integrated circuit of P1, wherein the local oscillator source comprises an input terminal operably coupled to an off-chip oscillator.

B. The Topaz Amplifier and its Duty Cycle

P7. A frequency converter integrated circuit operable in a transmit mode and a receive mode, the circuit comprising: a receive input; a receive output; a low-noise amplifier having an amplifier input operably coupled to the receive input and an amplifier output operably coupled to the receive output, the low-noise amplifier controllably operable in a powered mode when the integrated circuit is in the receive mode, and an unpowered mode when the integrated circuit is not in the receive mode.

P8. The frequency converter integrated circuit of P7, further comprising: a mode controller in control communication with the low-noise amplifier to controllably change between the powered mode and the unpowered mode.

II. Opal {Front-End}

A. The Opal Amplifier and its Duty Cycle

P9. A 5G front-end integrated circuit operable in a transmit mode and a receive mode, the circuit comprising: a transmit input; a transmit output; a high-performance power amplifier having an amplifier input operably coupled to the transmit input and an amplifier output operably coupled to the transmit output, the high-performance power amplifier controllably operable in a powered mode when the integrated circuit is in the transmit mode, and an unpowered mode when the integrated circuit is not in the transmit mode.

P10. The front-end integrated circuit integrated circuit of P9, further comprising: mode controller in control communication with the high-performance power amplifier to controllably change between the powered mode and the unpowered mode.

B. Asymmetric T/R Switch

P11. A front-end integrated circuit operable in a transmit mode and a receive mode, comprising: an antenna interface; an interface switch having: a pole in electrical communication with the antenna interface to alternately receive signals from the antenna interface and provide signals to the antenna interface; a receive throw characterized by a receive insertion loss when the receive throw is coupled to the pole; and a transmit throw having a transmit insertion loss when the transmit throw is coupled to the throw, wherein the transmit insertion loss and the receive insertion loss are asymmetric.

P12. The 5G front-end integrated circuit of P11, wherein the receive insertion loss is at least two times the transmit insertion loss.

P21. An integrated circuit transceiver system having a transmit channel and two receive channels associated with the transmit channel, the system comprising: a transmit channel comprising: (1) a transmit input terminal; a transmit output terminal; a transmit signal path operably coupled between the transmit input terminal and the transmit output terminal, the transmit signal path including a transmit up-conversion mixer; and also comprising (2) a first receive channel comprising: a first receive input terminal; a first receive output terminal; a first receive signal path operably coupled between the first receive input terminal and the first receive output terminal, the first receive signal path including a first receive down-conversion mixer; and (3) a second receive channel comprising: a second receive input terminal; a second receive output terminal; a second receive signal path operably coupled between the second receive input terminal and the second receive output terminal, the second receive signal path including a second receive down-conversion mixer; and (4) a local oscillator input terminal configured to receive a local oscillator signal having a first frequency; an LO generation system coupled to the local oscillator input terminal, and configured to upconvert the first frequency to a second, higher frequency to produce an LO drive signal, the LO generation system operably coupled to: the first receive down-conversion mixer to provide the LO drive signal to the first receive down-conversion mixer; and the transmit up-conversion mixer to provide the LO drive signal to the transmit up-conversion mixer, and to the second receive down-conversion mixer to provide the LO drive signal to the second receive down-conversion mixer; whereby the transmit channel is associated, by their shared LO drive signal, with the first receive channel and the second receive channel, whereby the system has two receive channels for each transmit channel.

P31. A method of operating a transceiver system for processing an incoming modulated signal, the method comprising: providing transceiver integrated circuits having two receive channels (a first receive channel and a second receive channel) for each transmit channel; receiving the incoming modulated signal at each of two associated receive channels, and processing the incoming modulated signal through each of the two associated receive channels, whereby the transceiver system is rendered more robust than a system with a single receive channel.

P32. The method of P31, wherein the first receive channel is configured to process signals that are vertically-polarized, and the second receive channel is configured to process signals that are horizontally-polarized, and the incoming modulated signal received at the first receive channel is vertically-polarized, and the incoming modulated signal received at the second receive channel is horizontally-polarized.

What is claimed is:

1. An integrated circuit transceiver system having a transmit channel and two receive channels associated with the transmit channel, the system comprising:
    the transmit channel comprising a transmit signal path including a transmit up-conversion mixer;
    a first receive channel comprising a first receive signal path including a first receive down-conversion mixer;
    a second receive channel comprising a second receive signal path including a second receive down-conversion mixer;
    a local oscillator input terminal configured to receive a local oscillator signal having a first frequency;
    an LO generation system coupled to the local oscillator input terminal, and configured to upconvert the first frequency to a second, higher frequency to produce a first LO drive signal and a second LO drive signal, the LO generation system operably coupled to:
        the first receive down-conversion mixer to provide the first LO drive signal to the first receive down-conversion mixer; and
    an LO switch having an input coupled to the LO generation system to receive the second LO drive signal, a first output coupled to the transmit up-conversion mixer, and a second output coupled to the second receive down-conversion mixer, the LO switch configured, in a receive configuration, to controllably couple the second LO drive signal to the second receive down-conversion mixer, and in a transmit configuration to couple the second LO drive signal to the transmit up-conversion mixer such that the second LO drive signal is coupled to only one of the second receive down-conversion mixer or the transmit up-conversion mixer at a time;
    whereby the transmit channel is associated, by their shared LO drive signal, with the first receive channel and the second receive channel.

2. The system of claim 1, wherein the LO generation system comprises:
    a first local oscillator multiplier coupled to a local oscillator input terminal, and configured to upconvert the first frequency to the second, higher frequency to produce the first LO driver signal, the first local oscillator multiplier operably coupled to:
        the first receive down-conversion mixer to provide the first LO drive signal to the first receive down-conversion mixer; and
    a second local oscillator multiplier coupled to the local oscillator input terminal, and configured to upconvert the first frequency to the second, higher frequency to produce the second LO drive signal.

3. The system of claim 1, wherein the transmit channel, the first receive channel and the second receive channel are on a single integrated circuit, the single integrated circuit further comprising the LO switch.

4. The system of claim 1, further comprising a mode controller in control communication with the LO switch to control the LO switch to change between the receive configuration and the transmit configuration.

5. The system of claim 1, wherein the first receive channel further comprises:
    a first receive input; and
    a low-noise amplifier operably coupled between the first receive input and the first receive down-conversion mixer, the low-noise amplifier controllably operable in a powered mode and an unpowered mode, the low-noise amplifier in the powered mode when the LO signal is coupled to the first receive down-conversion mixer, and in the unpowered mode when the LO signal is not coupled to the first receive down-conversion mixer.

6. The system of claim 5, wherein the first receive channel further comprises:
    a mode controller, the mode controller:
        in control communication with the LO switch to control the LO switch to change between the receive configuration and the transmit configuration; and
        in control communication with the low-noise amplifier to control the low-noise amplifier to change between the powered mode and the unpowered mode, the low-noise amplifier in the powered mode when the LO signal is coupled to the first receive down-conversion mixer, and in the unpowered mode when the LO signal is not coupled to the first receive down-conversion mixer.

7. The system of claim 1, wherein the transmit channel further comprises:
    a transmit input;
    a transmit output;
    a high-performance power amplifier having an amplifier input operably coupled to the transmit input and an amplifier output operably coupled to the transmit output, the high-performance power amplifier controllably operable in a powered mode when the system is in the transmit configuration, and an unpowered mode when the system is not in the transmit configuration.

8. The system of claim 7, further comprising mode controller in control communication with the high-performance power amplifier to controllably change the high-performance power amplifier between the powered mode when the system is in the transmit configuration, and the unpowered mode when the system is not in the transmit configuration.

9. An integrated circuit transceiver system having a transmit channel and two receive channels associated with the transmit channel, the system comprising:
- a first integrated circuit comprising:
  - a transmit input terminal,
  - a transmit output terminal,
  - the transmit channel comprising a transmit signal path including a transmit up-conversion mixer,
  - a local oscillator input terminal configured to receive a local oscillator signal having a first frequency, and
  - an LO generation system coupled to the local oscillator input terminal, and configured to upconvert the first frequency to a second, higher frequency to produce an LO drive signal, the LO generation system operably coupled to the transmit up-conversion mixer to provide the LO drive signal to the transmit up-conversion mixer,
- the first integrated circuit further comprising:
  - an LO output terminal;
  - an on-chip LO power divider having an input coupled to the LO generation system, a first on-chip power divider output and a second on-chip divider output, the local oscillator power divider configured to divide an output of the LO generation system into a second LO drive signal at the second on-chip divider output, and an output LO drive signal at the first on-chip divider output;
  - the second on-chip divider output operably coupled to the transmit up-conversion mixer;
  - the first on-chip divider output operably coupled to the LO output terminal; and
- a second integrated circuit comprising:
  - a first receive input terminal,
  - a first receive output terminal,
  - a first receive channel comprising a first receive signal path including a first receive down-conversion mixer;
  - a second receive input terminal,
  - a second receive output terminal,
  - a second receive channel comprising a second receive signal path including a second receive down-conversion mixer,
  - a first receive LO input terminal and a second receive LO input terminal; and
- an off-chip LO power divider having:
  - an off-chip divider input operably coupled to the LO output terminal of the first integrated circuit;
  - a first off-chip divider output operably coupled to the first receive LO input terminal of the second integrated circuit, the LO generation system thereby operably coupled to the first receive down-conversion mixer to provide the LO drive signal to the first receive down-conversion mixer; and
  - a second off-chip divider output operably coupled to the first receive LO input terminal of the second integrated circuit, the LO generation system thereby operably coupled to the first receive down-conversion mixer to provide the LO drive signal to the first receive down-conversion mixer;
  - whereby the transmit channel is associated, by their shared LO drive signal, with the first receive channel and the first receive channel.

10. The system of claim 9, further comprising:
a beam former circuit, the beam former circuit comprising:
- a third integrated circuit having transmit channels and receive channels, the third integrated circuit having a first antenna terminal coupled to a first patch array antenna; and
- a fourth integrated circuit having only receive channels, the fourth integrated circuit having a second antenna terminal coupled to a second patch array antenna.

11. The system of claim 9, further comprising a substrate, wherein the first integrated circuit, the second integrated circuit and the off-chip LO power divider all disposed on the substrate.

12. The system of claim 11, wherein the substrate comprises a printed circuit board.

* * * * *